(12) United States Patent
Genetti et al.

(10) Patent No.: US 6,934,606 B1
(45) Date of Patent: Aug. 23, 2005

(54) AUTOMATIC CALIBRATION OF A WAFER-HANDLING ROBOT

(75) Inventors: Damon Genetti, Los Gatos, CA (US); Wayne Tang, Union City, CA (US); Mikhail Bojinov, Sunnyvale, CA (US); Stephan Minard, Pleasanton, CA (US)

(73) Assignee: Novellus Systems, Inc., San Jose, CA (US)

( * ) Notice: Subject to any disclaimer, the term of this patent is extended or adjusted under 35 U.S.C. 154(b) by 57 days.

(21) Appl. No.: 10/600,667

(22) Filed: Jun. 20, 2003

(51) Int. Cl.[7] .......................... G05B 19/00; G05B 19/18
(52) U.S. Cl. ..................... 700/254; 700/217; 700/218; 700/189; 700/190; 700/245; 700/258; 700/259; 700/261; 700/262; 700/260; 700/54; 700/8; 318/560; 901/15; 901/16; 901/21; 901/39; 340/668.5; 701/23; 118/715; 118/712; 118/728
(58) Field of Search ................................ 700/217–218, 700/189–190, 245, 254, 258–262; 318/560; 901/15–16, 901/21, 39; 340/668.5; 701/23; 118/712, 118/715, 728

(56) References Cited

U.S. PATENT DOCUMENTS

| | | | |
|---|---|---|---|
| 5,382,806 A | * | 1/1995 | Bacchi et al. .......... 250/559.29 |
| 6,063,196 A | * | 5/2000 | Li et al. ...................... 118/712 |
| 6,188,323 B1 | * | 2/2001 | Rosenquist et al. ....... 340/686.5 |
| 6,327,517 B1 | * | 12/2001 | Sundar ........................ 700/245 |
| 6,591,160 B2 | * | 7/2003 | Hine et al. ................... 700/218 |
| 6,629,053 B1 | * | 9/2003 | Mooring ....................... 702/94 |
| 6,648,730 B1 | * | 11/2003 | Chokshi et al. ................ 451/6 |

OTHER PUBLICATIONS

Lento, Wafer Handling And FAB Automation: Using an integrated controller to manage wafer-handling systems, 2001, Internet, pp. 1-8.*

Berkeley Process Control, Inc., Semiconductor Components, 2003, Internet, pp. 1-2.*

Robotic alignment overview, Microtool.net; Webpage [online][retrieved on Sep. 22, 2003]; Downloaded from the internet: URL:www.microtool.net.

* cited by examiner

Primary Examiner—Thomas G. Black
Assistant Examiner—McDieunel Marc
(74) Attorney, Agent, or Firm—Okamoto & Benedicto LLP

(57) ABSTRACT

In one embodiment, a wafer-handling robot in a wafer processing system is automatically calibrated by determining an orientation of the robot relative to a chassis of the wafer processing system, determining hand-off coordinates of a load port in the wafer processing system, and determining hand-off coordinates of a load lock in the wafer processing system. Also disclosed is a calibration fixture for automatically calibrating the wafer-handling robot to the load port.

25 Claims, 17 Drawing Sheets

AUTOMATIC CALIBRATION OF A WAFER-HANDLING ROBOT

BACKGROUND OF THE INVENTION

1. Field of the Invention

The present invention relates generally to robots, and more particularly but not exclusively to robots employed in wafer processing systems.

2. Description of the Background Art

In semiconductor wafer processing systems, robots are employed to move wafers from one location to another. For example, a robot may be employed to pick up a wafer from a wafer cassette in a loading port, and move the wafer to a load lock. From the load lock, another robot or wafer transfer mechanism may move the wafer to a reactor where the wafer is processed, or to an intermediate location, such as a transfer chamber. Robots advantageously allow processing of wafers with minimum operator intervention.

To accurately place and pick up wafers, a robot needs to know the coordinates of various locations in the wafer processing system. Because of variations between wafer processing systems, coordinates are programmed into a robot after it is installed in a wafer processing system. Programming location coordinates into a robot, also referred to as "robot calibration", is oftentimes done manually by a technician or a field service engineer. Thus, depending on the number of hand-off (i.e., pick and place) locations, calibrating a robot may take some time, and can be tedious and error-prone. In a production environment, replacing a failing robot with a new one consumes valuable production time because the new robot will have to be calibrated before the wafer processing system can be brought back up to process wafers.

SUMMARY

In one embodiment, a wafer-handling robot in a wafer processing system is automatically calibrated by determining an orientation of the robot relative to a chassis of the wafer processing system, determining hand-off coordinates of a load port in the wafer processing system, and determining hand-off coordinates of a load lock in the wafer processing system. Also disclosed is a calibration fixture for automatically calibrating the wafer-handling robot to the load port.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of apparatus, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, well known mathematical operations for determining feature positions, distances, centers of objects, and the like have been omitted in the interest of clarity.

Figure 1A:
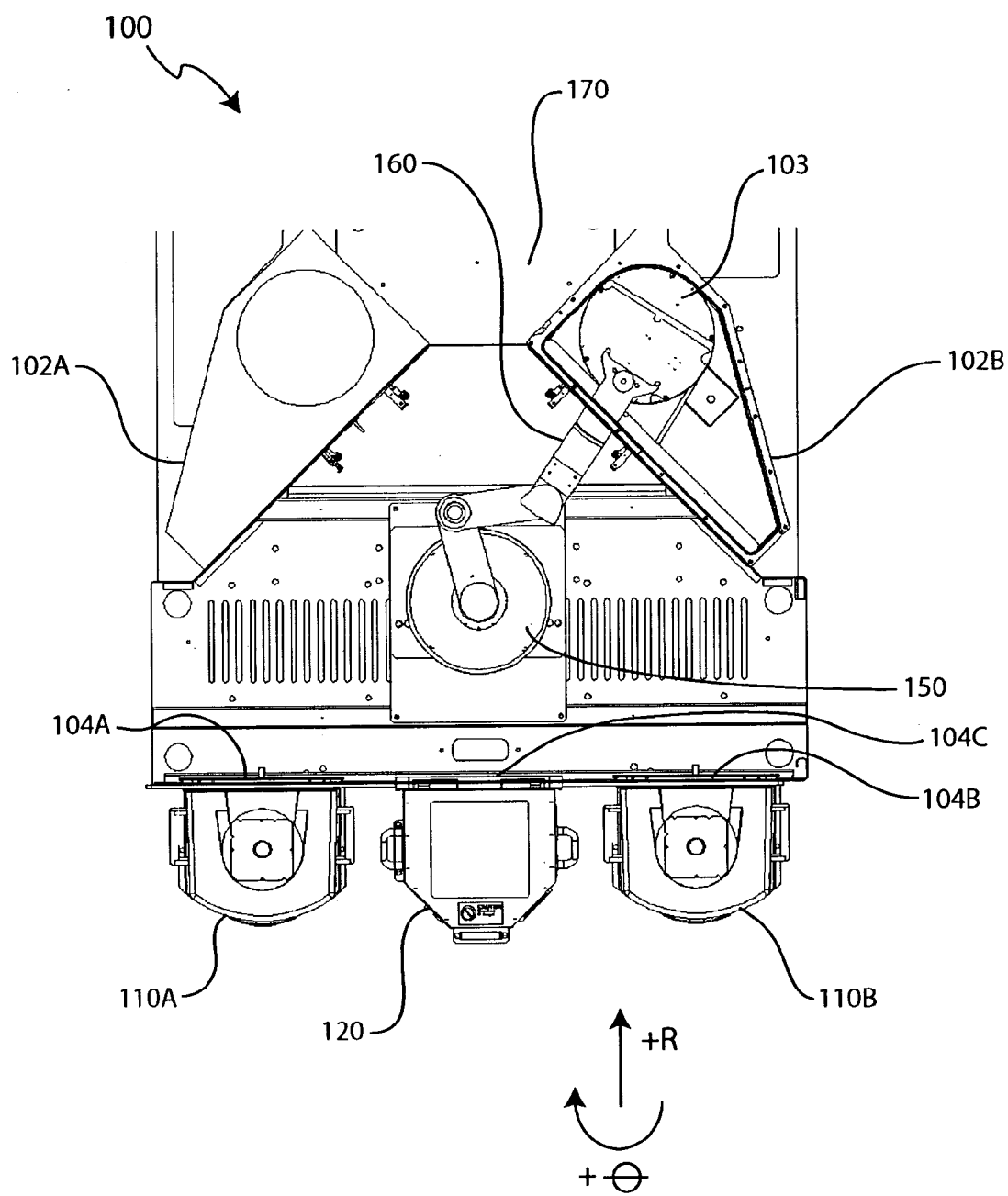
FIGS. 1(a)–1(e) show various views of a wafer processing system configured in accordance with an embodiment of the present invention.

FIG. 1(a) shows a plan view of a wafer processing system 100 in accordance with an embodiment of the present invention. System 100 includes one or more load ports 104 (i.e., 104A, 104B, 104C), a robot 150, one or more load locks 102 (i.e., 102A, 102B), and a process module 170. A load port 104 allows one or more wafers to be loaded into system 100. For example, wafers to be processed may be placed in a wafer cassette, which is then loaded into a load port 104. In one embodiment, a load port 104 conforms to SEMI (Semiconductor Equipment And Materials International) standards and accepts front opening unified pods (FOUP). A load port 104 may also accept other types of wafer loading modules, such as standard mechanical interface (SMIF) pods, cassette modules, and automated guided vehicle (AGV) interfaces. In the example of FIG. 1(a), a FOUP 110A is attached to a load port 104A, while a FOUP 110B is attached to a load port 104B. A load port fixture 120, which serves as a calibration fixture for calibrating robot 150 to a load port 104, is depicted as being attached to a load port 104C. Load port fixture 120 is normally attached to a load port being calibrated. Thus, load port fixture 120 may be attached to other load ports. Load port fixture 120 is further discussed in connection with FIGS. 4(a)–4(d).

Robot 150 may be a multi-link robot suitable for handling wafers in a wafer processing system. Robot 150 is configured to move wafers between load locks 102 and load ports 104. In one embodiment, robot 150 is an atmospheric robot of the type commercially available from Brooks-PRI Automation, Inc. of Chemlsford, Mass. under the model name ATR-7/ATR-8™ robot. Robot 150 includes an end-effector 160 for supporting a wafer. Robot 150 is configured to impart rotational ("θ", or theta), radial ("R"; radially from the center of robot 150), and vertical ("Z"; height) motion to end-effector 160. Thus, end-effector 160 may pick up a wafer from a pick up location by rotating to face the pick up location, lowering to a position below the wafer, extending to the pick up location, and rising to pick up the wafer. Similarly, end-effector 160 may place a wafer to a placement location by rotating to face the placement location, extending to the placement location, and then lowering the wafer on the placement location. It is to be noted that a single location may both be a pick up and a placement location depending on whether a wafer is being picked-up from or placed in that location. For purposes of the present disclosure, the term "hand-off location" refers to a location where a wafer is transferred either by picking up or placing the wafer. In addition, sentences referring to actions performed by robot 150 may indicate the actuation of end-effector 160 depending on the context. For example, the phrase "robot 150 picking up a wafer from a load lock" also means "end-effector 160 entering the load lock and picking up the wafer."

In the example of FIG. 1(a), system 100 includes a load lock 102A also referred to as the "left load lock", and a load lock 102B also referred to as the "right load lock". Load locks 102A and 102B have similar components, except that one is a mirror image of the other. Thus, unless otherwise specified, components and features discussed herein with reference to load lock 102B equally apply to load lock 102A, and vice versa. Note that load lock 102B is depicted in the figures with its top cover removed to show components and features of a load lock 102.

Each load lock 102 may include a pedestal 103 (see load lock 102B) for supporting a wafer thereon. Each load lock 102 may also include a wafer transfer mechanism (see wafer transfer mechanism 122 in FIG. 1(d)) for moving a wafer between a load lock 102 and process module 170. The Wafer transfer mechanism is further discussed in connection with FIG. 1(d). Pedestals and wafer transfer mechanisms that may be employed inside load locks are also discussed in the following commonly-assigned disclosures, which are incorporated herein by reference in their entirety: U.S. application Ser. No. 09/888,017, entitled "HIGH-THROUGHPUT ARCHITECTURE FOR SEMICONDUCTOR PROCESSING, filed by Craig L. Stevens on Jun. 21, 2001; U.S. application Ser. No. 10/020,333, entitled "LINEAR TRANSFER MECHANISM FOR TRANSPORTING WORKPIECES", filed by Richard M. Blank on Dec. 12, 2001; and U.S. application Ser. No. 09/887,202, entitled "MAGNETICALLY COUPLED LINEAR SERVO-DRIVE MECHANISM", filed by Thomas M. Pratt et al. on Jun. 21, 2001.

Load locks 102 isolate process module 170 from atmospheric pressure. This allows process module 170 to remain under vacuum during normal operation. For example, a wafer may be transferred between load lock 102B and process module 170 by closing all gates (e.g., transfer valves; see gates 105 and 118, and transfer valve module 124 of FIG. 1(d)) of load lock 102B, pumping down load lock 102B to substantially the same pressure as process module 170, and then opening a gate (e.g., gate 118) of load lock 102B facing process module 170. Similarly, a wafer may be transferred between load lock 102B and a FOUP 110 by closing all gates of load lock 102B, venting load lock 102B to atmospheric pressure, and then opening a gate (e.g., gate 105) of load lock 102B facing load ports 104. Load locks 102 may also be of the type disclosed in the incorporated disclosure U.S. application Ser. No. 09/888,017.

Process module 170 may include a chamber for processing semiconductor wafers. For example, process module 170 may include a chemical vapor deposition chamber for depositing a thin film on a wafer. In one embodiment, process module 170 is of the type employed in Concept Three SEQUEL® and Concept Three ALTUS® wafer processing systems, commercially available from Novellus Systems, Inc. of San Jose, Calif. Other process modules may also be employed in system 100 without detracting from the merits of the present invention.

In operation, wafers to be processed are loaded in a FOUP 110, arbitrarily chosen as FOUP 110A in this example. Robot 150 picks up a wafer from FOUP 110A and transfers the wafer to either load lock 102A or 102B, whichever is available. Assuming the wafer is transferred to load lock 102B, load lock 102B is sealed and then pumped down to substantially the same pressure as process module 170. Thereafter, the gate between load lock 102B and process module 170 is opened to allow the wafer to be transferred to process module 170 where the wafer is processed. After the wafer is processed, the wafer is transferred to either load lock 102B or load lock 102A. Assuming the wafer is transferred to load lock 102A, load lock 102A is sealed and vented to atmospheric pressure. Thereafter, the gate between load lock 102A and load ports 104 is opened to allow robot 150 to pick up the wafer and transfer it back to its original slot in FOUP 110A. The just described sequence of operation may be performed for one or more unprocessed wafers in a FOUP 110.

Figure 1B:
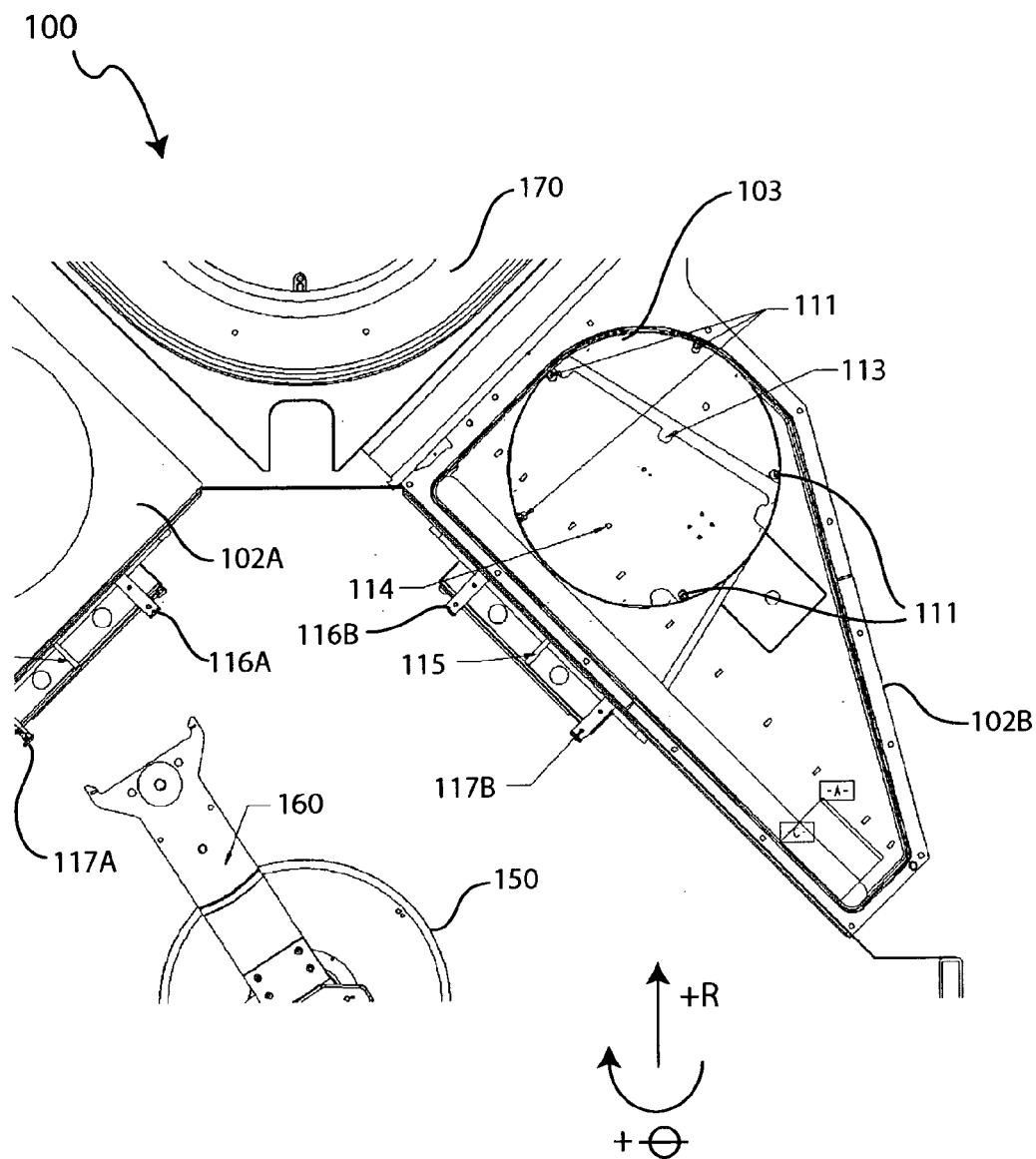

Referring now to FIG. 1(b), there is shown a closer view of load lock 102B depicting sensors and flags that may be employed to calibrate robot 150 in accordance with an embodiment of the present invention. Load lock 102B (and 102A) includes wafer presence sensor 114, and active wafer centering (AWC) sensors 116B and 117B (the counterpart AWC sensors in load lock 102A are labeled as 116A and 117B). In one embodiment, wafer presence sensor 114, AWC sensor 116 (i.e., 116A, 116B), and AWC sensor 117 (i.e., 117A, 117B) comprise vertically mounted through-beam sensors. That is, sensors 114, 116, and 117 may be mounted such that their respective beams extend along the Z-axis, which is perpendicular to the page of FIG. 1(b). The just mentioned sensors detect when their respective beams are broken, such as when an opaque object (e.g., a wafer or a portion of end-effector 160) blocks their beam.

Wafer presence sensor 114 detects when a wafer is inside load lock 102B. Placing a wafer on pedestal 103 blocks the beam of wafer presence sensor 114, thereby indicating that a wafer is inside the load lock. AWC sensors 116 and 117 are employed by a wafer centering system that performs in-transit wafer position measurement and correction. In one embodiment, the wafer centering system is of a type compatible with the ATR-7/ATR-8™ robot available from Brooks-PRI Automation, Inc. Other wafer centering systems may also be employed without detracting from the merits of the present invention. For example, when using a robot from another vendor, a wafer centering system from that vendor may be employed.

Still referring to FIG. 1(b), load lock 102B also includes an external Z flag 115 and an internal Z flag 112 (see FIG. 1(b)). FIG. 1(b) shows a location 113 where internal Z flag 112 would be generally located. In one embodiment, internal Z flag 112 is integral to the arm of the wafer transfer mechanism. Z flags 115 and 112 have an edge (e.g., a tab) that can be employed to break a sensor beam. As will be discussed below, end-effector 160 may include a horizontally mounted (i.e., along the plane of the page of FIG. 1(b)) beam that can be broken by moving end-effector 160 towards Z flag 115 or 112. End-effector 160 may thus be configured to find external Z flag 115 before entering the load lock in order to get a Z-position reference. Similarly, end-effector 160 may be configured to find internal Z flag 112 to get a Z-position reference inside the load lock.

FIG. 1(b) also shows cones 111 around the perimeter of pedestal 103. Cones 111 force a wafer to be aligned on pedestal 103 and also prevent horizontal motion of the wafer while on the pedestal.

Figure 1C:
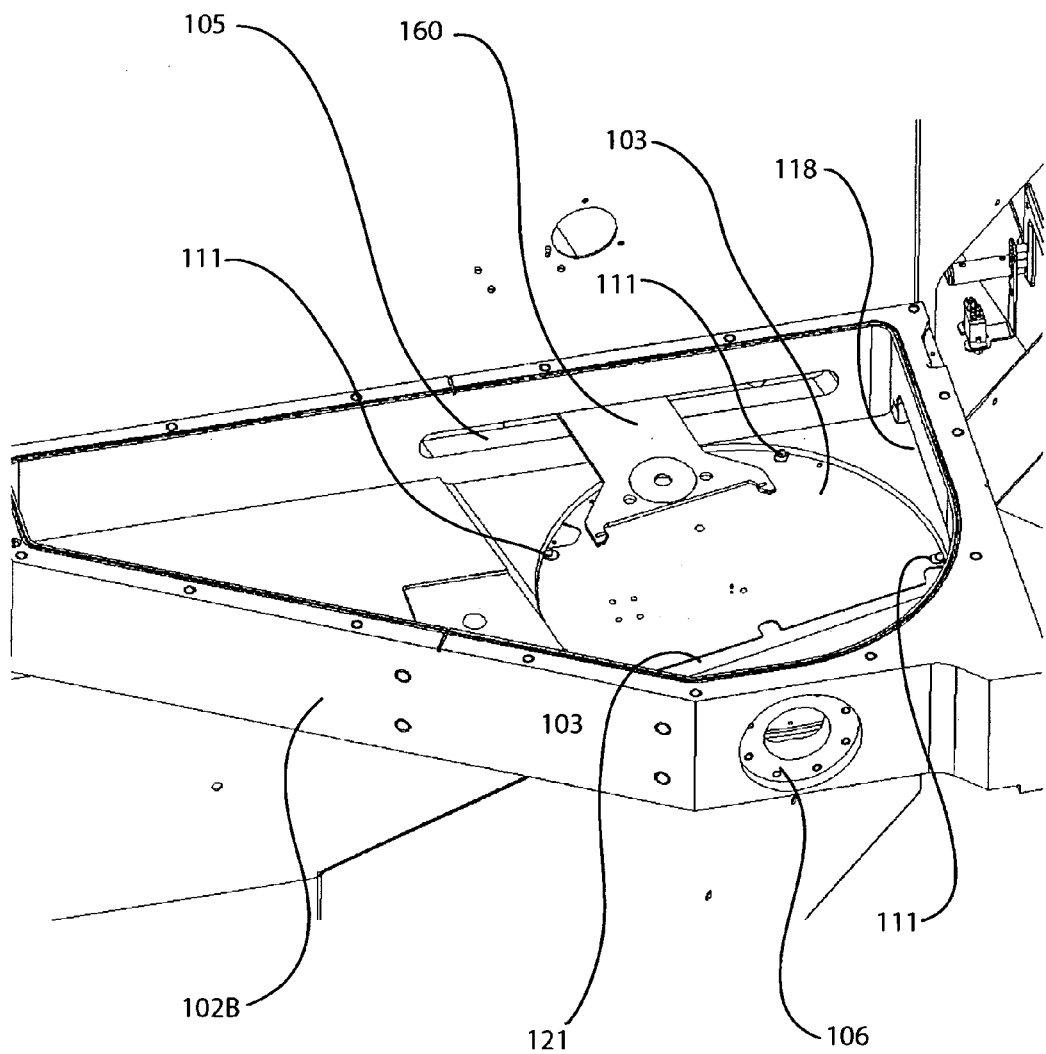

FIG. 1(c) shows a perspective view of load lock 102B. Load lock 102B includes a gate 105 facing load ports 104 and a gate 118 facing process module 170. Gates 105 and 118 may include transfer valves for sealing load lock 102B, for example. Load lock 102B may also include a viewing port 106. Viewing port 106 may be covered with a transparent quartz window to allow viewing of the insides of load lock 102B for monitoring or maintenance purposes. A cut-out 121 on pedestal 103 allows an arm of wafer transfer mechanism 122 (see FIG. 1(d)) to sink into pedestal 103 when pedestal 103 is in the up position as discussed further below. FIG. 1(c) also shows end-effector 160 through gate 105 and some of cones 111.

Figure 1D:
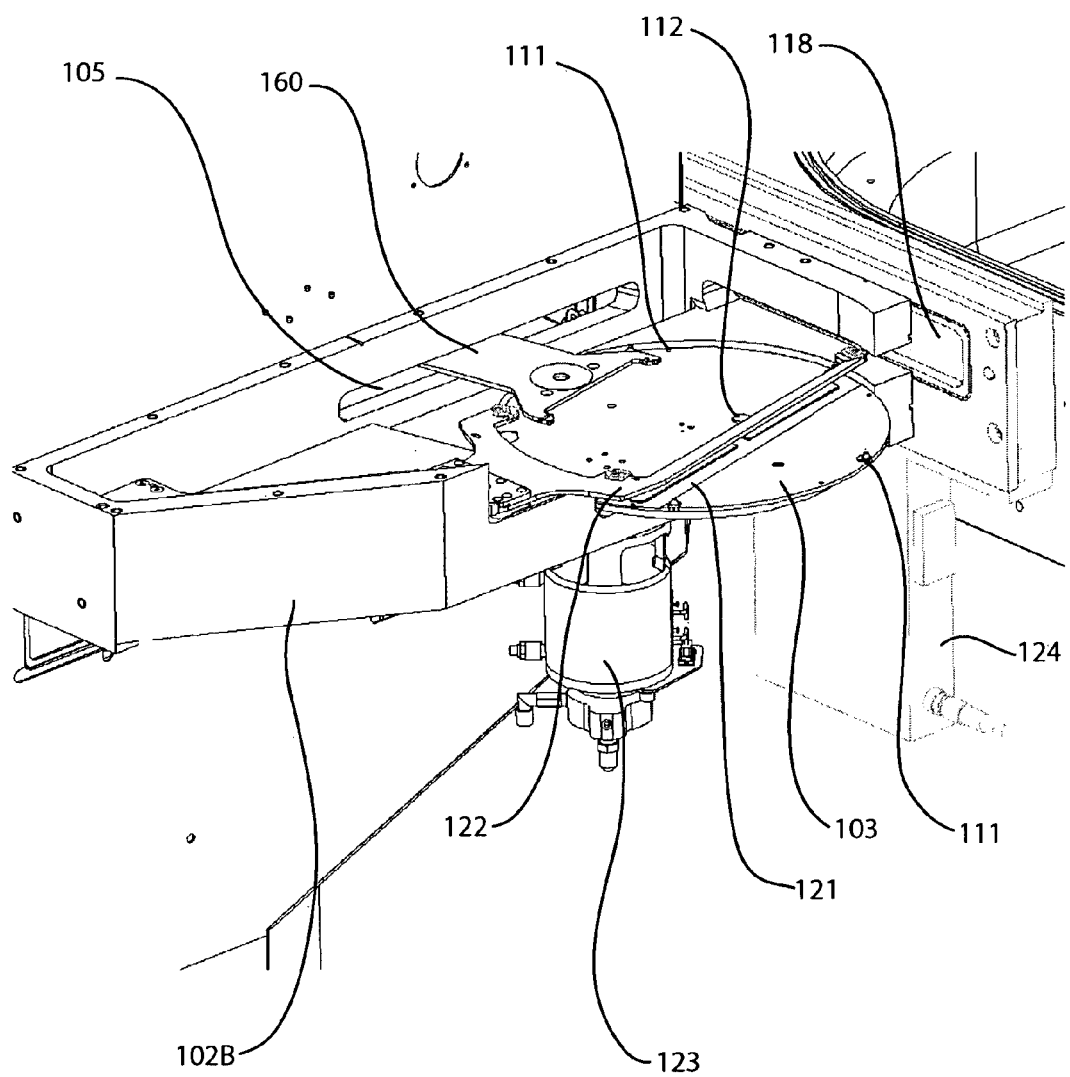

Referring to FIG. 1(d), a pneumatic lift 123 is mechanically coupled to pedestal 103. Pneumatic lift 123 may be actuated to lower or raise pedestal 103. FIG. 1(d) shows pedestal 103 in the lowered or down position. When pedestal 103 is placed in the raised or up position, the arm of wafer transfer mechanism 122 sinks into cut-out 121. This allows pedestal 103 to be higher than the arm of wafer transfer mechanism 122 when in the up position.

Figure 1E:
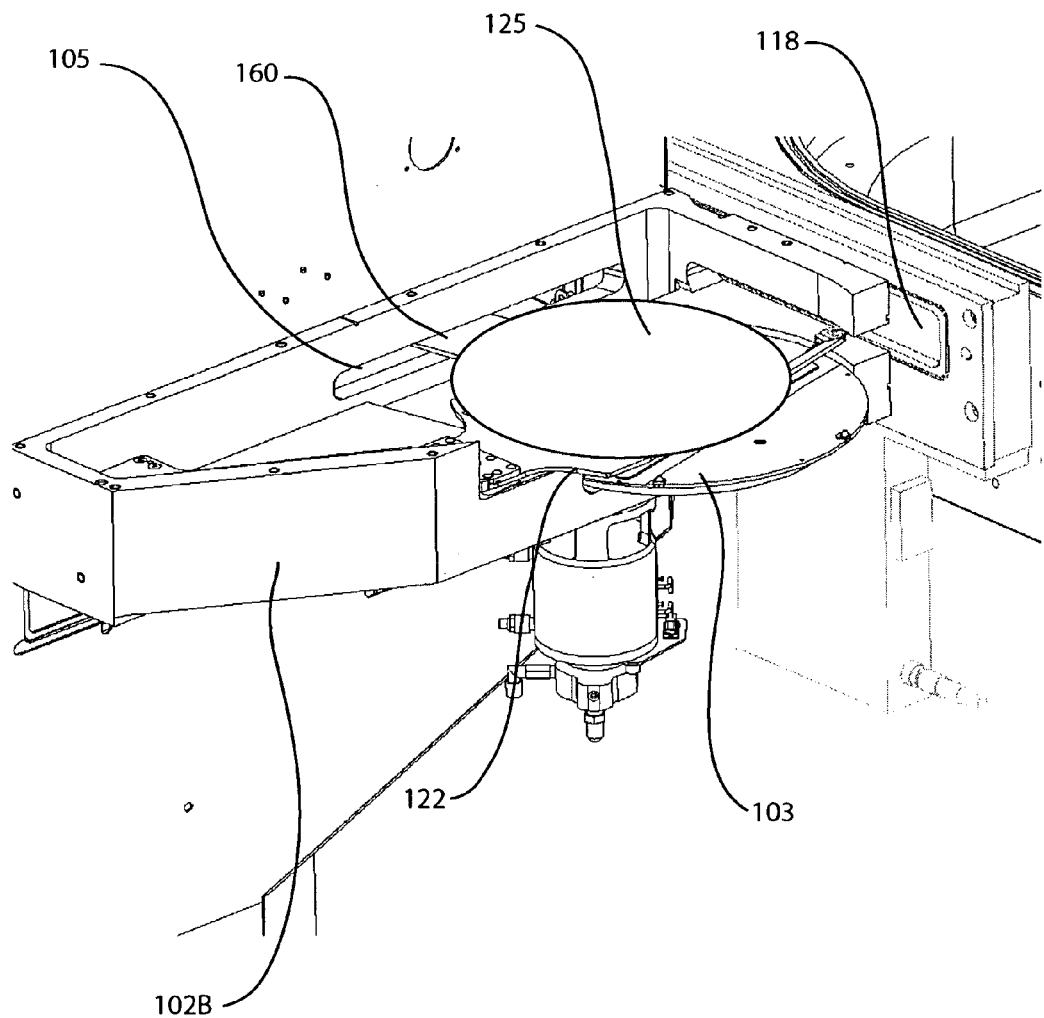

In operation, end-effector 160 may place a wafer 125 on the arm of wafer transfer mechanism 122 while pedestal 103 is in the down position as shown in FIG. 1(e). After end-effector 160 retracts from load lock 102B, pneumatic lift 123 is actuated to raise pedestal 103. This results in the arm of wafer transfer mechanism 122 sinking into cut-out 121, thereby transferring the wafer from wafer transfer mechanism 122 to pedestal 103. The wafer remains on pedestal 103 while load lock 102B is pumped down. Thereafter, pedestal 103 is placed in the down position to lower the wafer onto the arm of wafer transfer mechanism 122. Wafer transfer mechanism 122 is then driven towards gate 118 to move the wafer into process module 170.

After the wafer is processed, wafer transfer mechanism 122 is driven towards gate 118 to pick up the wafer. Wafer transfer mechanism 122 then retracts back into load lock 102B where pedestal 103 raises up to pick up the wafer. The wafer remains on pedestal 103 while load lock 102B is vented. Thereafter, pedestal 103 is placed in the down position to lower the wafer on the arm of wafer transfer mechanism 122, from which end-effector 160 picks up the wafer.

FIG. 1(d) also shows a transfer valve module 124 for opening and closing gate 118. A similar transfer valve module is also employed to open and close gate 105. Transfer valve module 124 may be of the same type as those available from VAT Inc. of Woburn Mass.

FIG. 1(e) shows a view similar to FIG. 1(d) with the addition of a wafer 125 being placed by end-effector 160 onto wafer transfer mechanism 122. In one embodiment, wafer 125 is a 300 mm semiconductor wafer.

Figure 2:
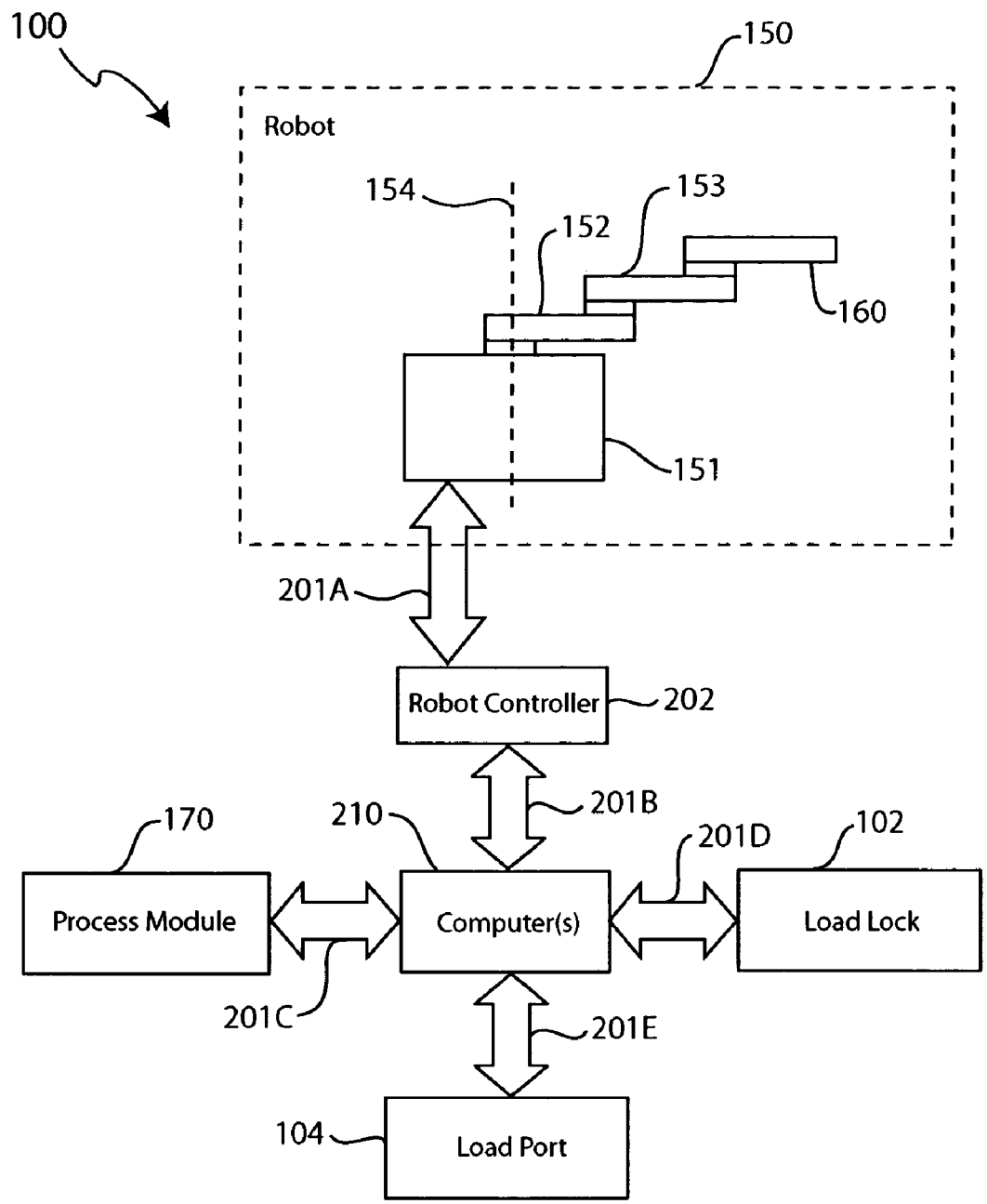
FIG. 2 shows a schematic diagram of a control system, in accordance with an embodiment of the present invention.

FIG. 2 shows a schematic diagram of a control system of system 100, in accordance with an embodiment of the present invention. System 100 may include one or more computers 210 in communication with load locks 102, load ports 104, process module 170, and a robot controller 202, which themselves may have one or more computers in communication with a computer 210. A computer may be a personal computer equipped with data acquisition and control cards, communication cards, and other control system components. In system 100, connection links 201 (i.e. 201A, 201B, . . . ) allow various modules (i.e., load lock 102, load port 104, process module 170) and computers to communicate. For example, connection links 201B, 201D, 201E, and 201C may be data network links (e.g., Ethernet, QNET) or cables comprising individual wires. A communication link 201 allows a computer 210 to receive status information (e.g., sensor states) or to send commands to various modules. It is to be noted that computer communications and data acquisition and control are, in general, known in the art and not further described here.

In the example of FIG. 2, a computer 210 is in communication with a robot controller 202 over a connection link 201B. Robot controller 202, in turn, is in communication with robot 150 over a connection link 201A. Robot controller 202 is depicted as separate from robot 150. However, robot controller 202 may also be integrated with robot 150. Robot controller 202 receives robot positioning commands from a computer 210. Robot controller 202 translates received positioning commands to control signals for driving the various motors that drive arm 152, arm 153, and end-effector 160. For example, robot controller 202 may receive a command to rotate end-effector 160. In that case, robot controller may send a control signal to rotate a motor (not shown) coupled to arm 152, and thereby rotate arm 152, arm 153, and end-effector 160 about axis 154. Arm 152, arm 153, and end-effector 160 may be mechanically coupled using a belt and pulley arrangement, for example.

Robot controller 202 may receive sensor information from robot 150, and send received sensor information to a computer 210. For example, robot controller 202 may be configured to receive electrical signals from a sensor in end-effector 160. Robot controller 202 may then convert that electrical signal into a form that can be understood by a computer 210. The electrical signal from the sensor may be represented by digital data bits that can be placed in a data packet for transmission to a computer 210. Position information from motor encoders may be similarly received and relayed by robot controller 202. Thus, a computer 210 may receive robot position information and sensor information from robot controller 210. This allows a computer 210 to know the position of robot 150 when a particular sensor is detected, and thereby determine the coordinates of that particular sensor.

Figure 3A:
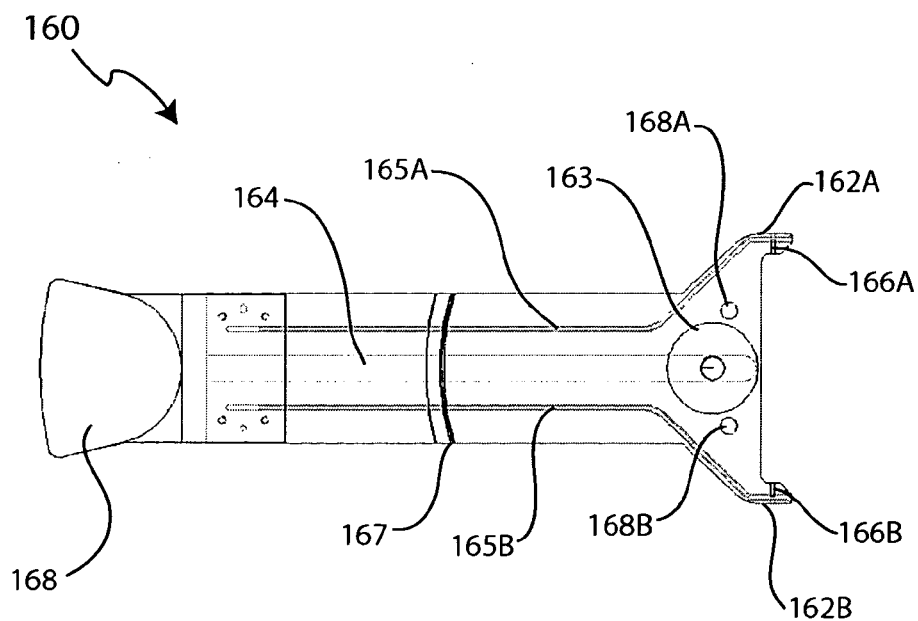
FIGS. 3(a)–3(d) show details of an end-effector in accordance with an embodiment of the present invention.

End-effector 160 is now further described with reference to FIGS. 3(a)–3(d). FIG. 3(a) shows an x-ray view of end-effector 160 in accordance with an embodiment of the present invention. End-effector 160 includes a horizontally mounted mapping sensor 166, comprising an emitter 166A and a detector 166B. Fiber optic cables 165 (i.e., 165A, 165B) couple mapping sensor 166 to an amplifier located within housing 168. Mapping sensor 166 may be a through-beam LED sensor—the amplifier detects when the beam is broken (or not broken) and so informs robot controller 202. Mapping sensor 166 may be employed to detect the Z coordinates (i.e., height) of protruding objects in the workspace of robot 150, which includes all locations reachable by end-effector 160. Preferably, mapping sensor 166 is employed to detect both the top and bottom surfaces of a protruding object. The Z coordinates obtained from detecting the top and bottom surfaces may be averaged to determine the center of the object in the Z axis.

Mapping sensor 166 may also be employed to detect the vertical edges of an object in system 100, and the object's radial position in the horizontal plane. For best results, the theta position of the detected object edge should also be known. Accordingly, end-effector 160 also includes alignment holes 168 (i.e., 168A and 168B) for locating sensor beams that are oriented vertically in the workspace of robot 150. The position of these sensor beams in terms of the coordinates of robot 150 may thus be determined by passing an alignment hole 168 over them. Examples of sensor beams that may be located using alignment holes 168 include those of wafer presence sensor 114 and AWC sensors 116 and 117.

Emitter 166A and detector 166B are housed in a left finger 162A and a right finger 162B, respectively, of end-effector 160. Fingers 162 (i.e., 162A, 162B) may be employed to break, and thereby detect, vertically oriented sensor beams. After a finger 162 is detected using a rough search algorithm, a fine search algorithm may be employed to find a nearby alignment hole 168 for better accuracy in determining the coordinates of the detected sensor. Generally speaking, an alignment hole 168 may be found by making rotational and radial sweeps, and taking into account the location of an alignment hole 168 relative to a detected finger 162. As a specific example, a vertically oriented sensor beam may be detected by rotationally sweeping end-effector 160 from side to side with intermediate forward radial movement. Once a finger 162 breaks (and thereby detects) the sensor beam, an adjacent hole alignment hole 168 is roughly aligned to the detected sensor beam knowing the distance between the alignment hole 168 and the finger 162 that broke the sensor beam. Thereafter rotational and radial sweeps may be performed to fine scan for the center of the alignment hole 168.

Still referring to FIG. 3(a), a vacuum chuck 163 is coupled to a pump (not shown) via a pump line 164 for securely holding a wafer supported on end-effector 160. Scribe marks 167 allow for visual inspection of the alignment of a supported wafer.

Figure 3B:
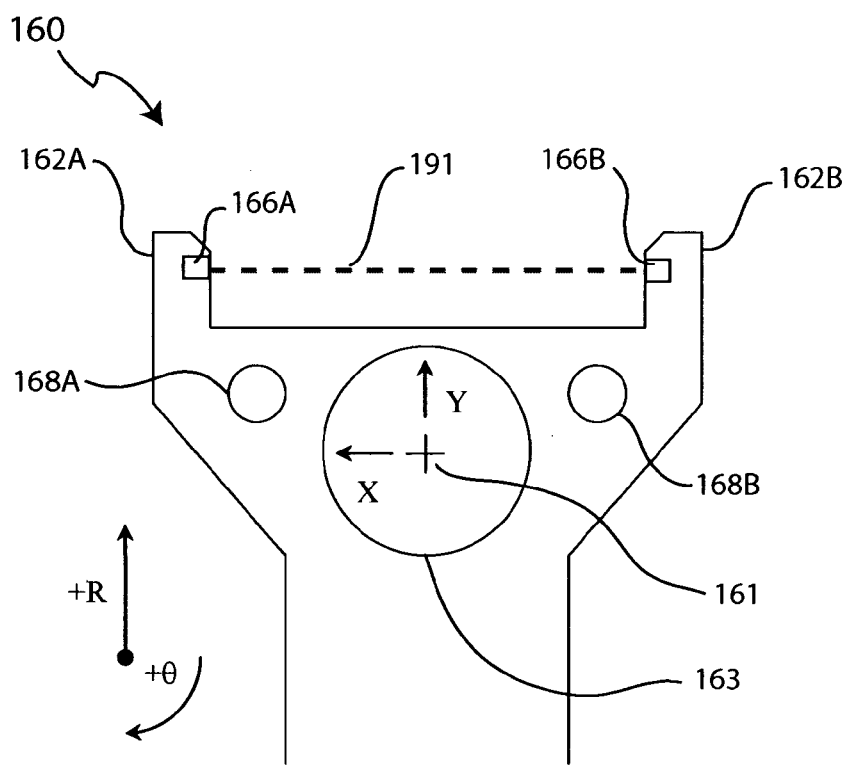

FIG. 3(b) schematically shows the features of end-effector 160 in the horizontal plane, in accordance with an embodiment of the present invention. Center 161, which is in the middle of vacuum chuck 163, is defined as the point in the horizontal plane that would coincide with the center of an ideally centered wafer. The radial and theta coordinates of robot 150 are referenced with respect to center 161. When robot 150 is in the R=0 (radial=0) position, center 161 is over the central axis of robot 150. The coordinate frame of end-effector 160, which may be in terms of the X-axis and Y-axis as shown in FIG. 3(b), is also referenced with respect to center 161. Robot 150 measures theta position in a clock-wise direction when viewing end-effector 160 from above. This results in the positive X-axis pointing left.

Figure 3C:
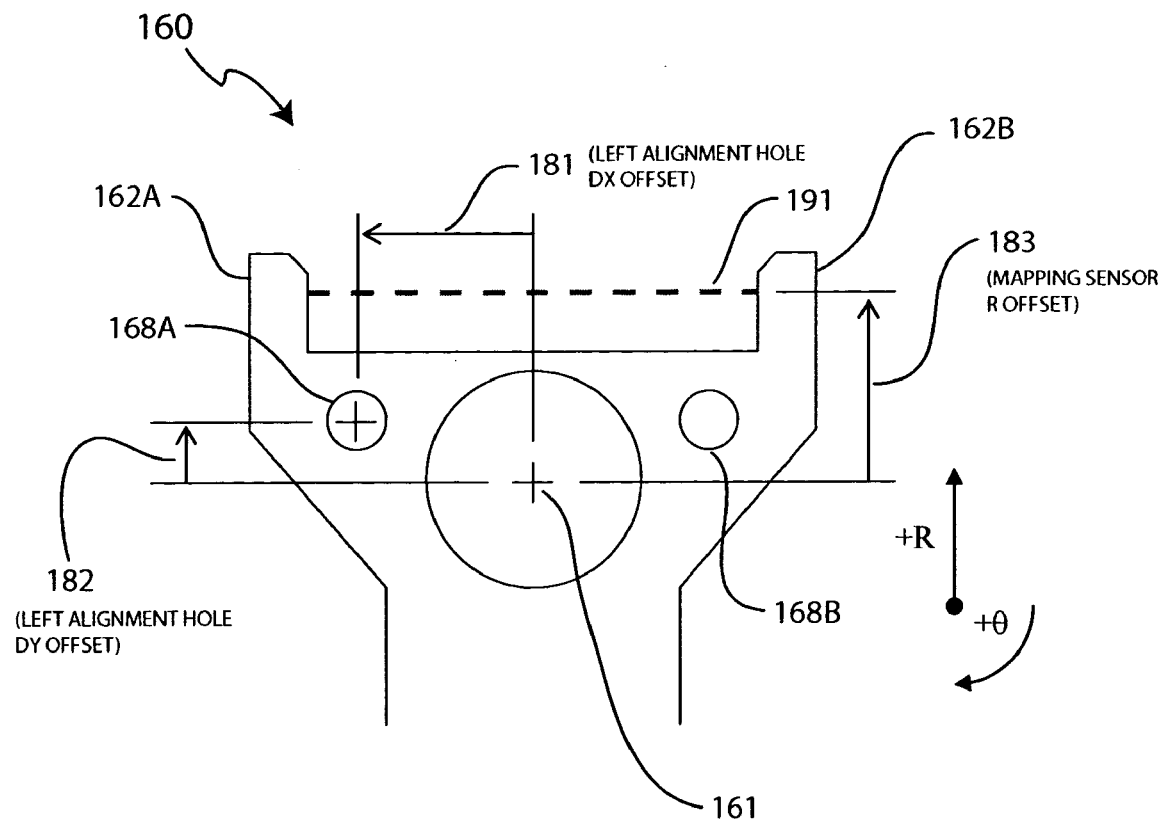

Preferably, a hole 168 is in the center of end-effector 160 for ease of calculation. However, because vacuum chuck 163 is in the center of end-effector 160, alignment holes 168 are offset in the X-axis and the Y-axis from center 161. In FIG. 3(c), the distance from center 161 to the center of alignment hole 168A in the X-axis is shown as DX offset 181, while the distance from center 161 to the center of alignment hole 168A in the Y-axis is labeled as DY offset 182. Because the values of DX offset 181 and DY offset 182 are fixed and known for a particular end-effector 160, the position of a detected sensor beam relative to center 161 may be determined using conventional mathematical operations. The position of a sensor beam detected using alignment hole 168B may be similarly found.

FIG. 3(c) also shows the radial distance between center 161 and sensor beam 191, which is labeled as R offset 183. Because R offset 183 is fixed and known for a particular end effector 160, the radial position of a detected object relative to center 161 may be determined.

Figure 3D:
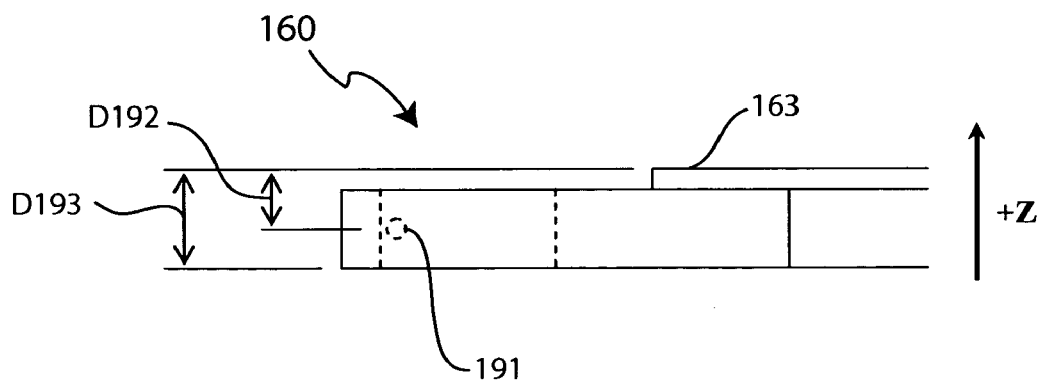

FIG. 3(d) schematically shows the features of end-effector 160 in the vertical plane, in accordance with an embodiment of the present invention. The Z coordinates of robot 150 is defined with respect to the top surface of vacuum chuck 163 (i.e., the surface that contacts a wafer). Dimension D192 from the top surface of vacuum chuck 163 to the center of sensor beam 191 and dimension D193 from the top surface of vacuum chuck 163 to the bottom surface of end-effector 160 may be predetermined to allow for translation of coordinates. For example, when an edge breaks sensor beam 191, the Z coordinate of that edge relative to the top surface of vacuum chuck 163 may be determined based on a known value for dimension D192. The value for dimension D192 (or D193) is fixed and known for a particular end-effector 160.

FIGS. 4(a)–4(d) show various views of load port fixture 120, in accordance with an embodiment of the present invention. Fixture 120 approximates the size and shape of a FOUP 110 to serve as a calibration fixture for calibrating robot 150 to load ports 104. Specifically, fixture 120 may be placed in a load port 104 to calibrate robot 150 to the load port. For example, fixture 120 may be placed in load port 104C to teach robot 150 the coordinates of hand-off locations in a real FOUP in load port 104C.

Figure 4A:
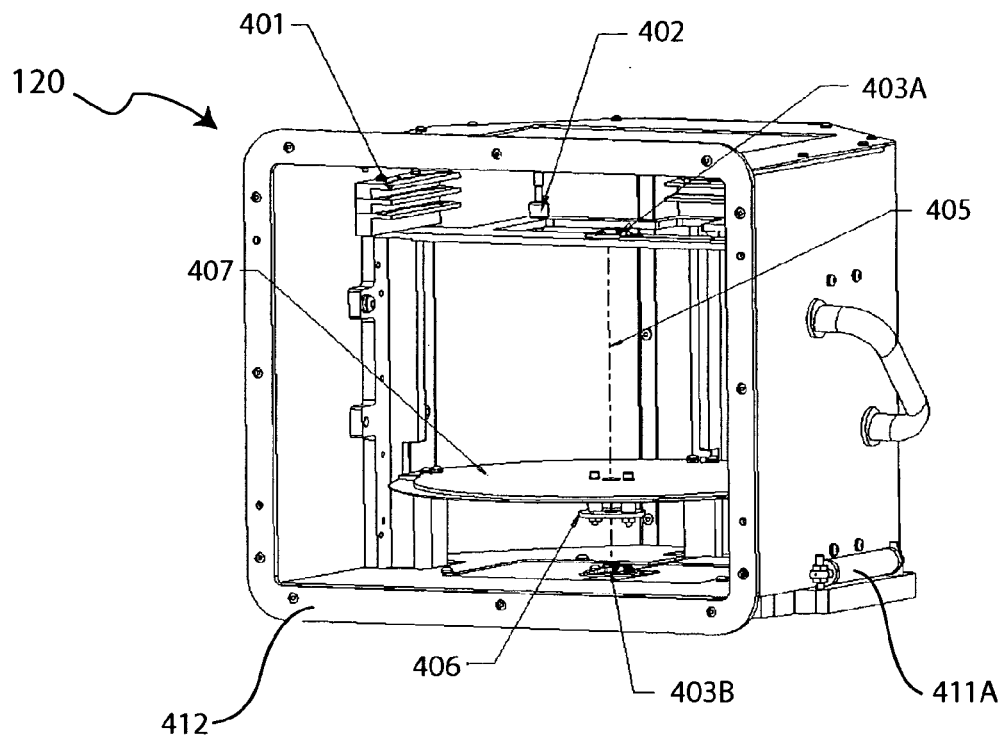
FIGS. 4(a)–4(d) show various views of load port fixture, in accordance with an embodiment of the present invention.

Referring to FIG. 4(a), fixture 120 includes seats 401 serving as slots 23, 24, and 25 of a 25-slot FOUP. A calibration disk 407 is in a nominal slot 5 position. A flag 406 is in a nominal slot 3 position, thus providing another Z axis reference for robot 150. A sensor 403, which comprises an emitter 403A and a detector 403B, provides a sensor beam 405 along the wafer center of fixture 120. Sensor 403 may be a through-beam LED sensor, for example. Positioning pins 402 limit the rearward movement of a wafer placed in slots 23, 24, and 25. Positioning pins 402 are also shown in FIG. 4(c). Fixture 120 includes a lip 412 so that fixture 120 may be attached to a load port 104 to maintain a mini-environment seal in compliance with SEMI specifications.

It is to be noted that for purposes of the present disclosure, the word "nominal" refers to a rough, approximate value. For example, a wafer in a nominal slot 5 location means that the wafer is positioned as if it is in slot 5 of a typical FOUP. As another example, a nominal location of an object is the approximate location of that object based on manufacturing or SEMI specifications. On the other hand, the word "measured" refers to a value obtained by detection. For example, having end-effector 160 find and break a sensor beam and then reading the position of end-effector 160 provide measured coordinates of that sensor beam.

Figure 4B:
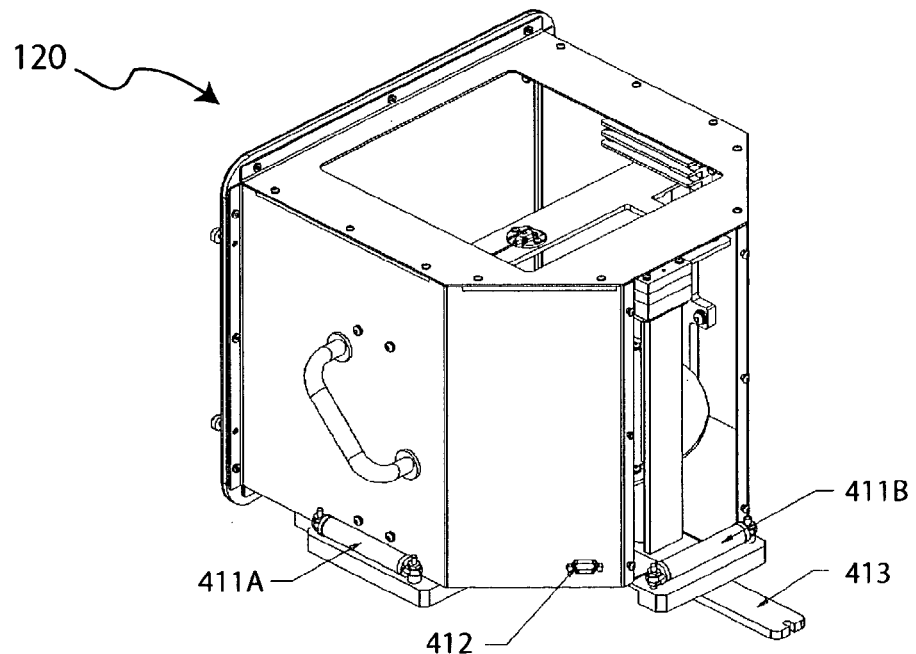
Figure 4C:
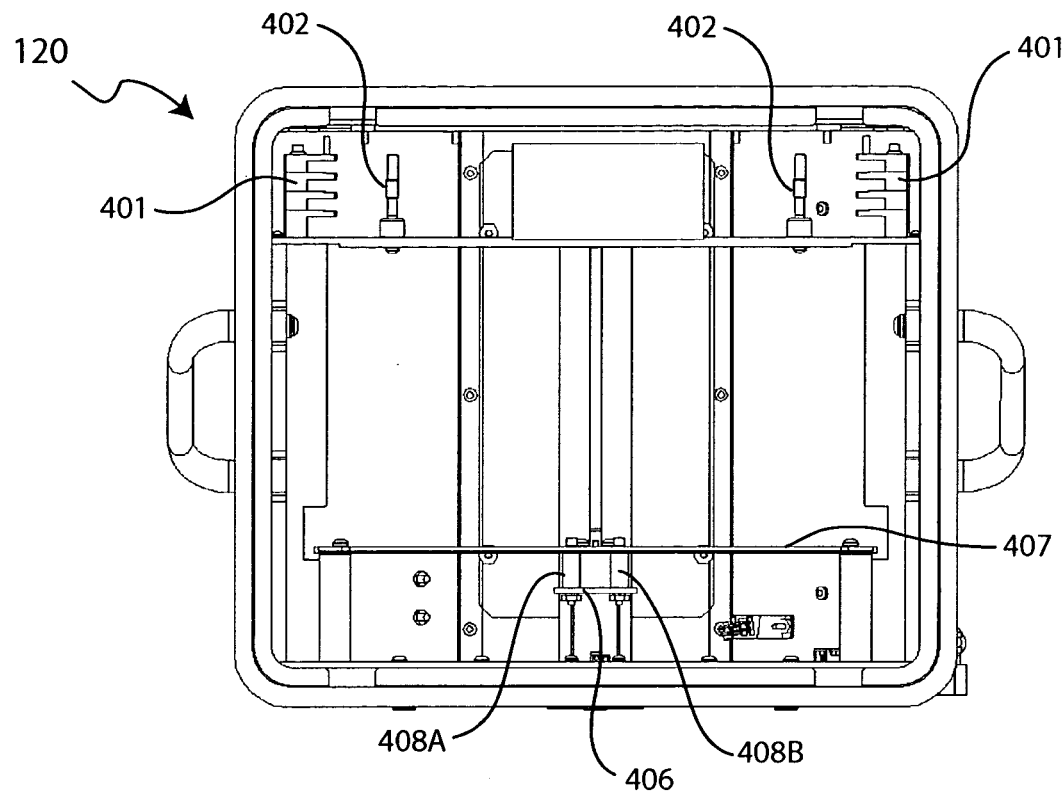

Referring to FIG. 4(b), precision levels 411 (i.e., 411A, 411B, . . . ) allow for visual inspection to ensure that fixture 120 is properly seated and that the load port 104 is level. A bolt-on plate 413 provides an extended plane that can be used for measuring the height of the load port 104, to ensure that it conforms to SEMI specifications. An interface port 412 allows signals from sensors within fixture 120 to be received in a robot controller 202 or a computer 210 over a cable, for example.

Referring to FIG. 4(c), calibration disk 407 is fixedly positioned in slot 5. This allows calibration disk 407 to serve as a "slot 5 wafer". Flag 406, which is positioned in slot 3, is fixedly attached to calibration disk 407 by bolts that go through spacers 408 (i.e., 408A, 408B). Flag 406 may be an aluminum disk that is about 1.75" in diameter and about 0.125" thick. FIG. 4(c) also shows the aforementioned seats 401 and positioning pins 402.

Figure 4D:
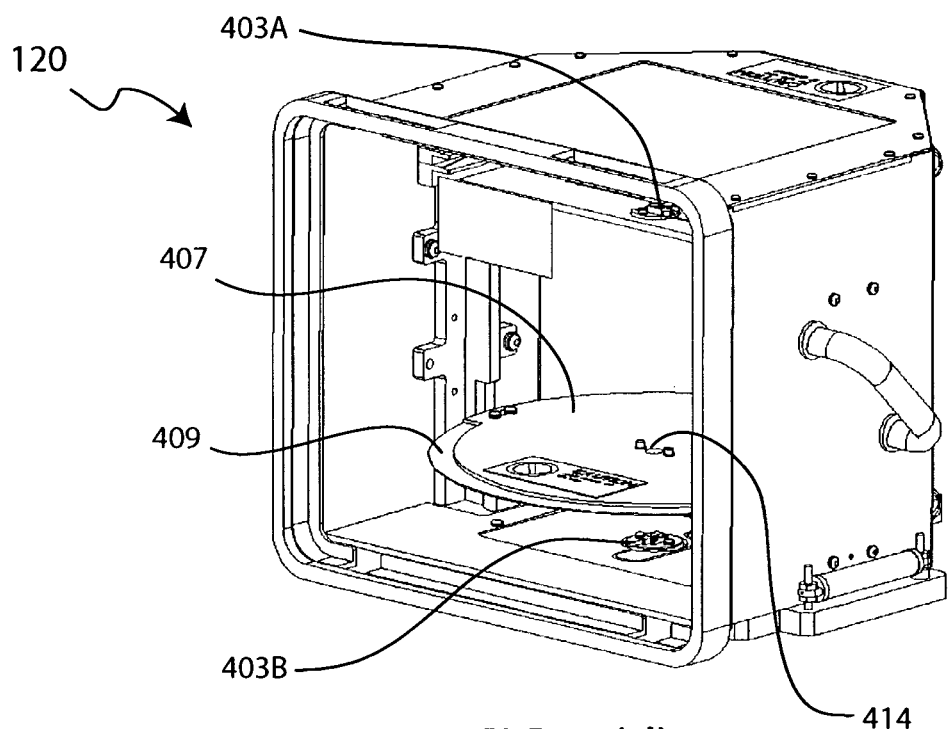

Referring to FIG. 4(d), calibration disk 407 includes a surface 409. Disk 407 may be about 11.81" in diameter and about 0.125" thick. Surface 409 may be about 0.030" thick to simulate a wafer for mapping calibration. Calibration disk 407 also has a hole 414 to allow beam 405 (see FIG. 4(a)) of sensor 403 to pass through.

Figure 5:
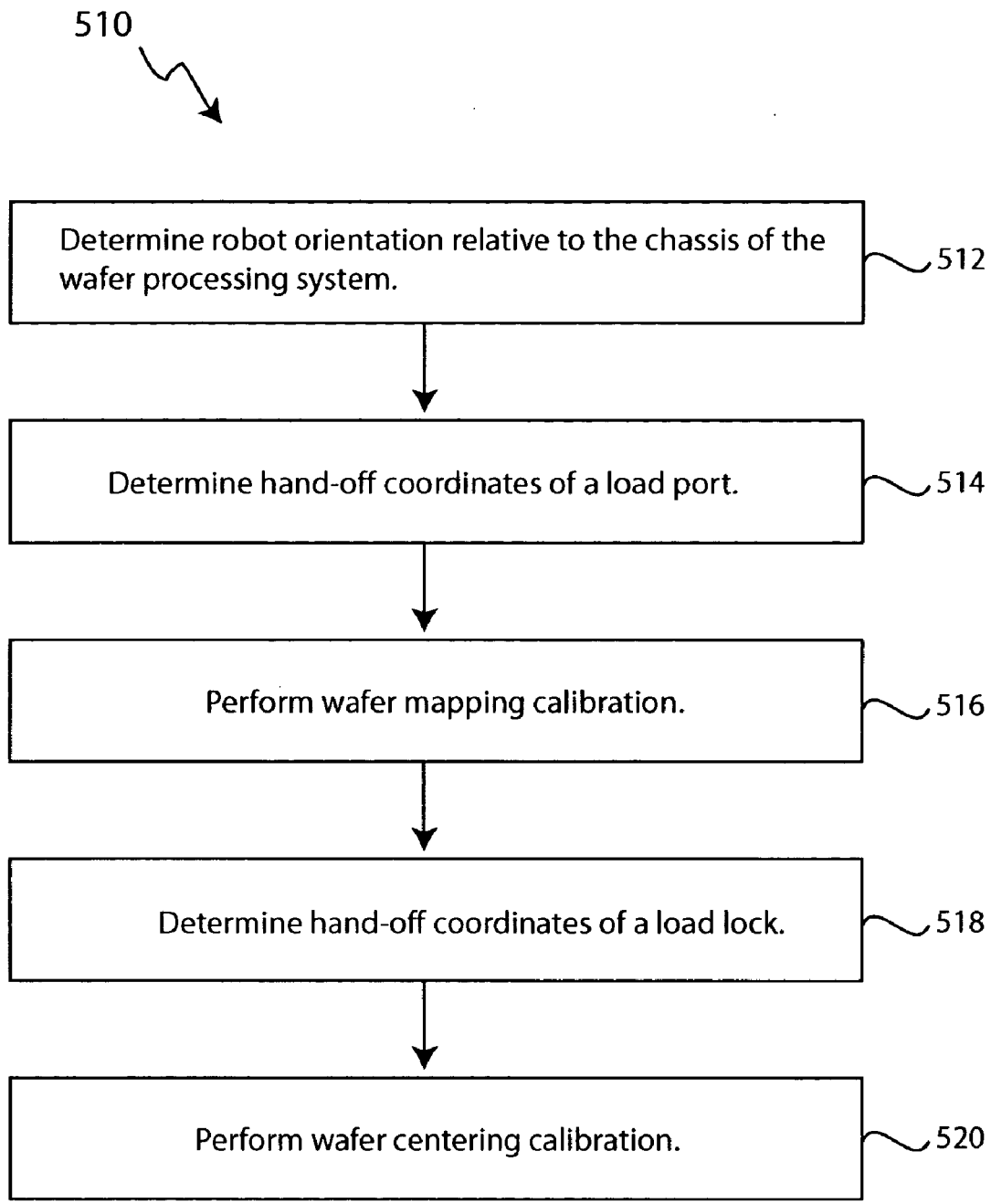
FIG. 5 shows a flow diagram of a method of automatically calibrating a wafer-handling robot, in accordance with an embodiment of the present invention.

FIG. 5 shows a flow diagram of a method 510 of automatically calibrating a wafer-handling robot, in accordance with an embodiment of the present invention. In one embodiment, method 510 is implemented in software running in a computer 210. It should be understood, however, that methods disclosed in the present disclosure may be implemented in hardware, software, or a combination of hardware and software (e.g., firmware). Software implementations may be in the form of computer programs comprising computer-readable program code stored in a computer-readable storage medium such as random access memory (RAM), mass storage device (e.g., local hard disk drive or remote hard disk drive accessible over the Internet), or removable storage device (e.g., optical storage device such as a CD-ROM or DVD). For example, a computer-readable storage medium may comprise computer-readable program code for performing the steps of a particular method. Likewise, computer memory may be configured to include computer-readable program code for a particular component, which may be executed by a microprocessor. Software implementations may be implemented separately in multiple modules or together in a single module. Methods may be implemented in computer-readable program code that are callable as functions, subroutines, and the like.

Method 510 and the other methods in the present disclosure are discussed with reference to specific components of wafer processing system 100. In particular, various sensors and components of system 100 are employed to facilitate automatic calibration of robot 150. It should be understood, however, that these methods are not so limited and may be adapted for use in other wafer processing systems. The steps of method 510 may be performed automatically using a computer 210 to control robot 150. If an error is encountered during any of its steps, method 510 may be terminated to allow an operator to diagnose and correct the error. Method 510 may be restarted thereafter.

In step 512, the orientation of robot 150 (see FIG. 1(b)) relative to the chassis of wafer processing system 100 is determined. This step allows a newly installed robot 150 to determine where it is in system 100 before determining hand-off coordinates in various modules, such as load ports and load locks. This step may be performed by having robot 150 detect an expected feature in a nominal location, comparing the coordinates of the detected expected feature with nominal coordinates, and then making appropriate coordinate adjustments. As a specific example, this step may be performed by having robot 150 detect AWC sensors 116 and 117 in both load locks 102A and 102B to determine the zero theta location of robot 150 relative to an expected nominal location in the chassis of system 100. The robot's radial zero location may be checked by calculating the distance between the AWC sensors of both load locks, and comparing the result to a known nominal value. A specific embodiment of step 512 is method 512A, which is later described with reference to FIG. 6.

In step 514, the hand-off coordinates of one or more load ports 104 (see FIG. 1(a)) are determined. This step may be performed by having robot 150 detect features (e.g., sensor beams and flags) of a FOUP-like fixture and comparing the result to nominal values. As a specific example, this step may be performed by having robot 150 detect the coordinates of features of load port fixture 120, comparing the result to SEMI specifications (which may be initially used to find the approximate location of the features), and then making appropriate coordinate adjustments. A specific embodiment of step 514 is method 514A, which is later described with reference to FIG. 7.

In step 516, wafer mapping calibration is performed. Wafer mapping calibration, in general, involves calibrating a robot so that it can find wafers in a wafer carrier, such as a FOUP. This step may be performed using a wafer mapping calibration routine supplied by the manufacturer of the robot. In one embodiment where robot 150 comprises the ATR-7/ATR-8™ robot, the wafer mapping calibration routine is of a type available from Brooks-PRI Automation, Inc. A specific embodiment of step 516 is method 516A, which is later described with reference to FIG. 8.

In step 518, the hand-off coordinates of one or more load locks 102 are determined. This step may be performed by having robot 150 detect features in a load lock 102. As a specific example, this step may be performed by having robot 150 detect a wafer presence sensor 114 (see FIG. 1(b)) of a load lock 102 and an edge of a pedestal 103 to determine approximate radial and rotational hand-off coordinates. Z hand-off coordinates may be determined by finding a wafer transfer plane in the load lock 102. Alignment corrections may be performed using a load lock calibration wafer and an algorithm that measures the location of the calibration wafer relative to end-effector 160. Knowing the location of the load lock calibration wafer relative to end-effector 160, robot 150 may place the load lock calibration wafer centered to approximate hand-off coordinates. The calibration wafer may then be picked-up by robot 150 once again, and re-measured relative to end-effector 160 to get a better approximation of the hand-off coordinates. The just described process of placing, picking up, and measuring the wafer may be repeated to fine tune the hand-off coordinates. A specific embodiment of step 518 is method 518A, which is later described with reference to FIGS. 9(a)–9(b).

In step 520, a wafer centering calibration is performed. Various known wafer centering techniques may be employed to perform this step. In one embodiment where robot 150 comprises the ATR-7/ATR-8™ robot, wafer centering calibration is performed using a routine available from Brooks-PRI Automation, Inc. A specific embodiment of step 520 is method 520A, which is later described with reference to FIG. 10.

Figure 6:
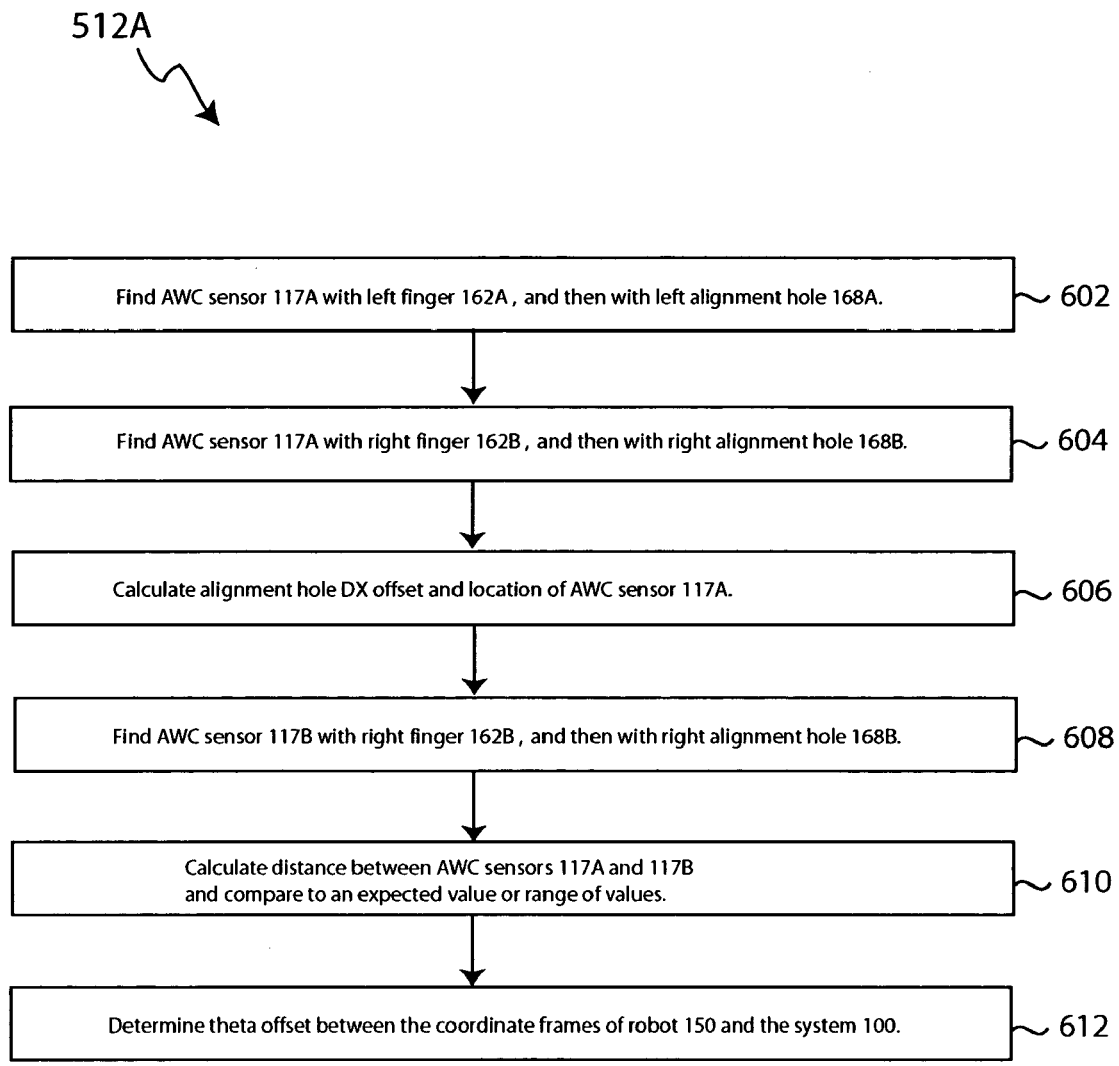
FIGS. 6–10 show flow diagrams of methods that may be employed in the steps of the method of FIG. 5.

FIG. 6 shows a flow diagram of method 512A, which is a specific embodiment of step 512 shown in FIG. 5. Steps 602, 604, and 606 refine the DX offset values (see FIG. 3(c)) of alignment holes 168 to minimize theta angle measurement bias that may occur when using only one of the alignment holes to locate a sensor beam. External sensors of a load lock are employed because, in this example, they are in relatively open space and thus leave room for end-effector 160 to perform scanning motions. Note that sensors other than AWC sensors may also be employed. In step 602, AWC sensor 117A of the left load lock 102A is found using left finger 162A of end-effector 160. Thereafter, AWC sensor 117A is found using alignment hole 168A. In step 604, AWC sensor 117A is found using right finger 162B, and then with right alignment hole 168B. In step 606, the DX offset for alignment holes 168 and the coordinates of AWC sensor 117A are calculated using data obtained in steps 602 and 604.

Steps 608, 610, and 612 check the robot radial axis calibration to ensure that robot 150 is properly installed in the chassis of system 100, and also determine a theta offset between the theta axes of robot 150 and system 100. In step 608, AWC sensor 117B of the left load lock 102B is found using right finger 162B, and then with right alignment hole 168B. In step 610, the distance between AWC sensor 117A (left load lock) and AWC sensor 117B (right load lock) are calculated using measured coordinates of AWC sensors 117A and 117B. The measured distance is compared to an expected distance. If the measured distance does not match the expected distance by an amount exceeding an error limit, robot 150 may have been incorrectly installed or may have a mechanical alignment problem. In that case, an operator may be alerted to correct the problem. In step 612, the theta offset between the theta axes of robot 150 and system 100 is found. Step 612 may be performed by comparing the measured and expected theta coordinates of AWC sensors 117A and 117B. The difference between the measured and expected theta coordinates may then be used to calculate a theta offset. The theta offset may be used to convert nominal chassis theta coordinates of robot 150 to theta coordinates of robot 150.

Figure 7:
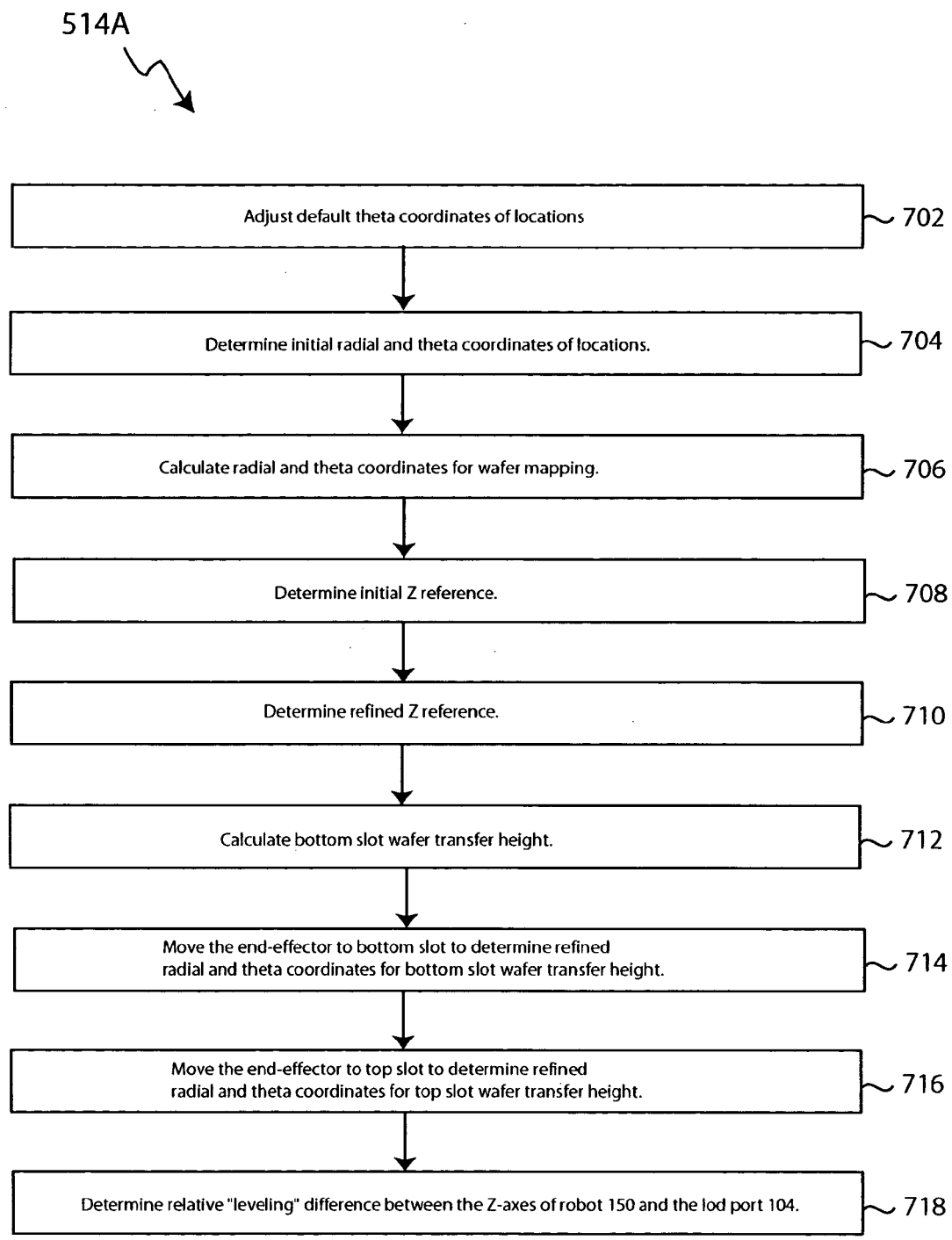

FIG. 7 shows a flow diagram of method 514A, which is a specific embodiment of step 514 shown in FIG. 5. In step 702, the theta coordinates of locations in fixture 120 (which simulates an actual FOUP in a load port) are adjusted using the theta offset found in step 612 of FIG. 6. In one embodiment, nominal theta coordinates of FOUPS in load ports 104 are stored in a table. The table may be adjusted with the theta offset to provide robot 150 with updated theta coordinates prior to moving into fixture 120.

In step 704, initial radial and theta coordinates are determined by finding sensor beam 405 (see FIG. 4(a)) using end-effector 160. For example, end-effector 160 may scan for sensor beam 405 in its nominal coordinates by first using a finger 162, then by using an alignment hole 168. End-effector 160 may scan for sensor beam 405 in the middle portion of fixture 120 using a nominal Z coordinate. The measured radial and theta coordinates of sensor beam 405 provides initial radial and theta coordinates for fixture 120, which is in load port 104C in this example.

In step 706, radial and theta coordinates needed for wafer mapping are calculated based on the initial radial and theta coordinates. That is, because sensor beam 405 is known to go through the center of wafers in a FOUP in a load port 104, and because FOUP's and wafers have a known geometry (e.g., based on specifications), radial and theta coordinates of locations in the FOUP may be calculated. The radial and theta coordinates of a via point outside a FOUP where the arms of robot 150 may have to curve around to access the FOUP may also be calculated in step 706.

In step 708, an initial Z reference for fixture 120 is determined. Step 708 may be performed by sweeping end-effector 160 up and down in the Z axis to find calibration disk 407 (see FIG. 4(a)) using sensor beam 191 (see FIG. 3(b)). Calibration disk 407 is known to be in a slot 5 location, and may thus be found using wafer mapping coordinates obtained in step 706. The measured location of calibration disk 407 provides an initial Z reference, which is the Z coordinate of a wafer in slot 5 in this example.

In step 710, the initial Z reference determined in step 708 is refined. Step 710 may be performed by finding flag 406 (see FIG. 4(a)) using sensor beam 191. Flag 406 is expected to be found in slot 3 and has a smaller diameter than calibration disk 407. Compared to surface 409 (see FIG. 4(d)) of calibration disk 407, the outer edge of flag 406 is closer to center 161 (see FIG. 3(b)) when sensor beam 191 is broken. This allows flag 406 to provide a better Z reference compared to calibration disk 407 as end-effector 160 is closer to the extension used to pick and place wafers at the FOUP.

In step 712, the bottom slot wafer transfer height is calculated. In one embodiment, the bottom slot is defined to be slot 1. The wafer transfer height is the Z coordinate for transferring a wafer to a slot, which is the bottom slot in this example. The wafer transfer height for slot 1 may be calculated using the measured slot 3 location obtained in step 710, the nominal slot pitch, and desired hand-off clearances.

In step 714, end-effector 160 is moved to the bottom slot to determine refined radial and theta coordinates for the bottom slot. In the bottom slot, end-effector 160 may scan for and locate sensor beam 405, thus getting measured radial and theta coordinates for the bottom location. As mentioned, slot 1 is defined as the bottom slot in one embodiment.

In step 716, end-effector 160 is moved to the top slot to determine refined radial and theta coordinates for the top slot. In one embodiment, slot 20 is defined as the top slot. Slot 25 is the preferred top slot in a 25-slot FOUP (or FOUP-like fixture such as fixture 120). However, in one embodiment, slots 23–25 of fixture 120 are reserved for storing calibration wafers. In that embodiment, moving end-effector 160 to slot 20 to scan for and locate sensor beam 405 provides measured radial and theta coordinates for the "top slot".

In step 718, the relative leveling difference (i.e., height misalignment) between the Z-axes of robot 150 and load port 104 is determined. In the example where slot 20 is used as the top slot in a 25-slot FOUP, the radial and theta coordinates of slot 25 is first determined by interpolating measured radial and theta coordinates of slots 1 and 20. Using the interpolated coordinates of slot 25, the angular difference between the Z-axes of robot 150 and load port 104 may be calculated to determine a leveling difference. If the leveling difference exceeds an allowable range, automatic calibration of robot 150 may be interrupted to alert an operator.

Figure 8:
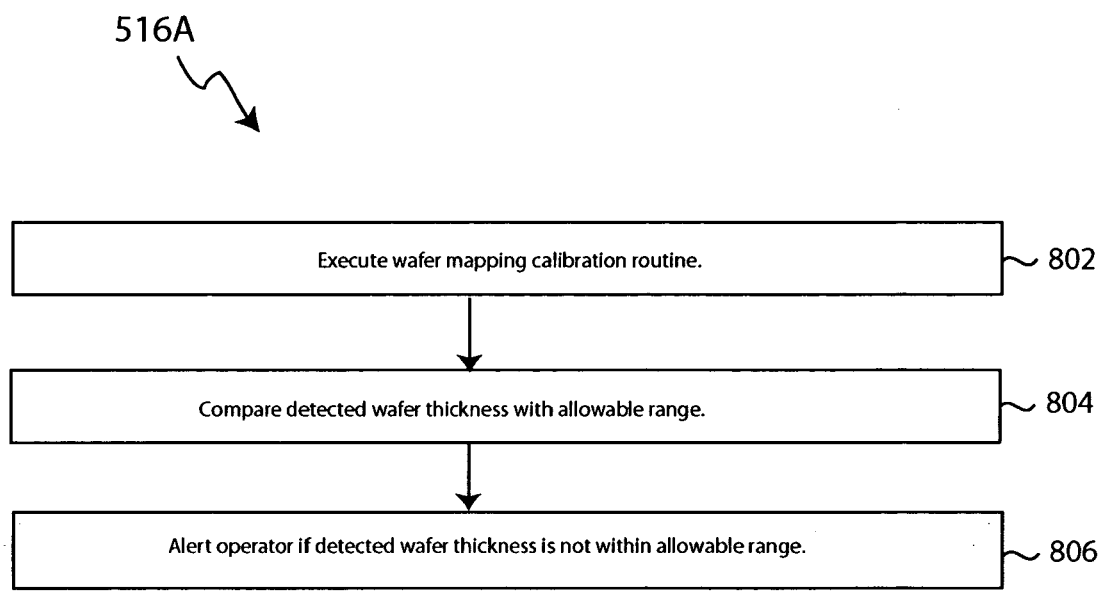

FIG. 8 shows a flow diagram of method 516A, which is a specific embodiment of step 516 shown in FIG. 5. In step 802, the wafer mapping calibration routine of robot 150 is initiated. As mentioned, in the embodiment where robot 150 comprises the ATR-7/ATR-8™ robot, the wafer mapping calibration routine is of the type available from Brooks-PRI Automation, Inc. Other wafer mapping calibration routines may also be employed without detracting from the merits of the present invention. A wafer mapping calibration routine may accept data obtained using method 514A of FIG. 7 to determine and set the proper radial, theta, and Z coordinates for the mapping scan.

In one embodiment, wafer mapping calibration is performed by performing a series of Z axis moves to pass sensor beam 191 (see FIG. 3(b)) over the edge of surface 409 of calibration disk 407 (see FIG. 4(d)). Knowing the speed at which end-effector 160 is moving in the Z direction and the amount of time sensor beam 191 is broken as it passes by slot 5, the measured thickness of surface 409 may be determined. In step 804, the measured thickness of surface 409 is compared to an allowable range. If the measured thickness is not within the allowable range, this indicates that there may be a problem with mapping sensor 166 or that its amplifier is not properly adjusted. In that case, an operator is alerted as indicated in step 806.

Figure 9A:
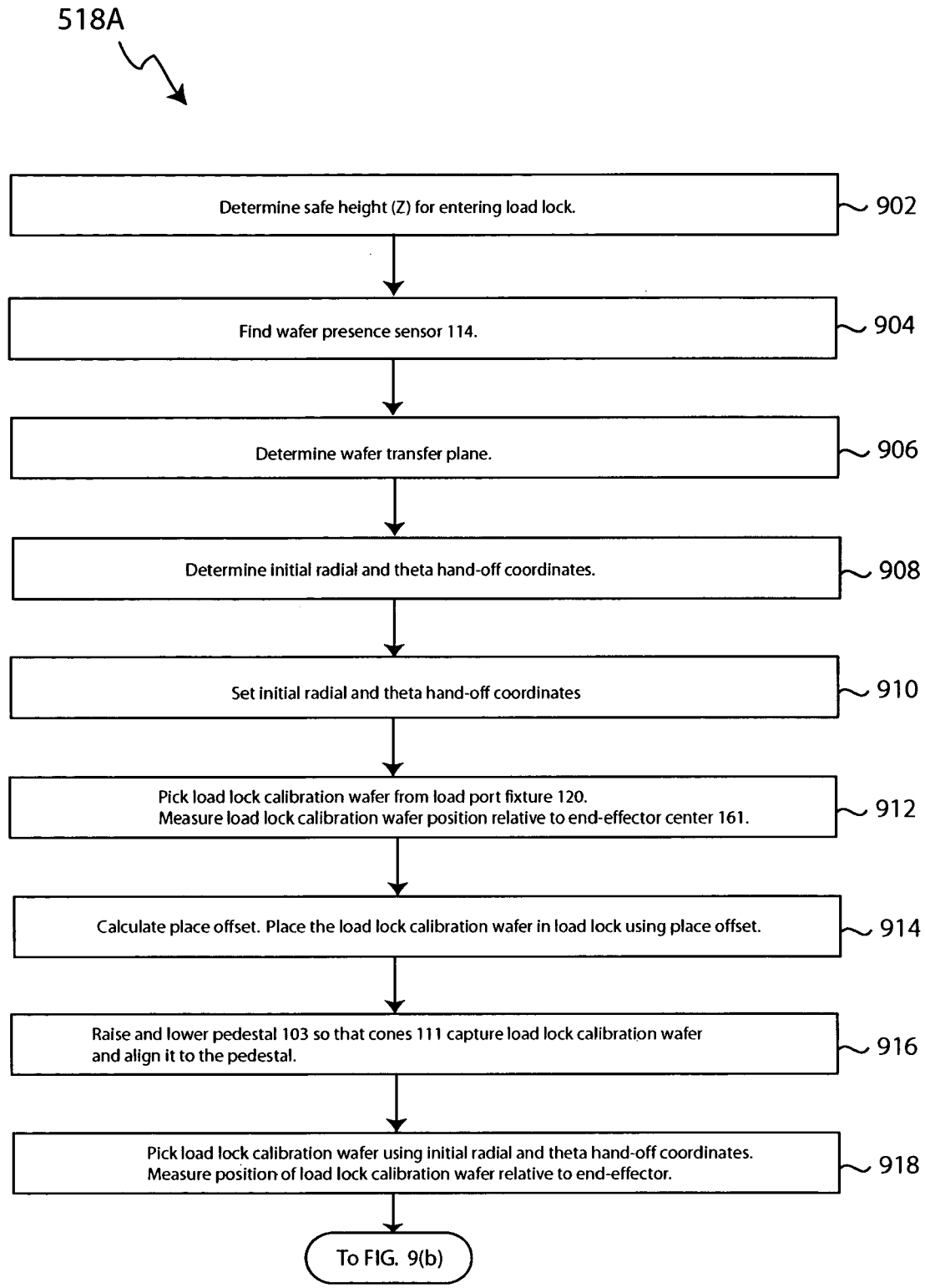
Figure 9B:
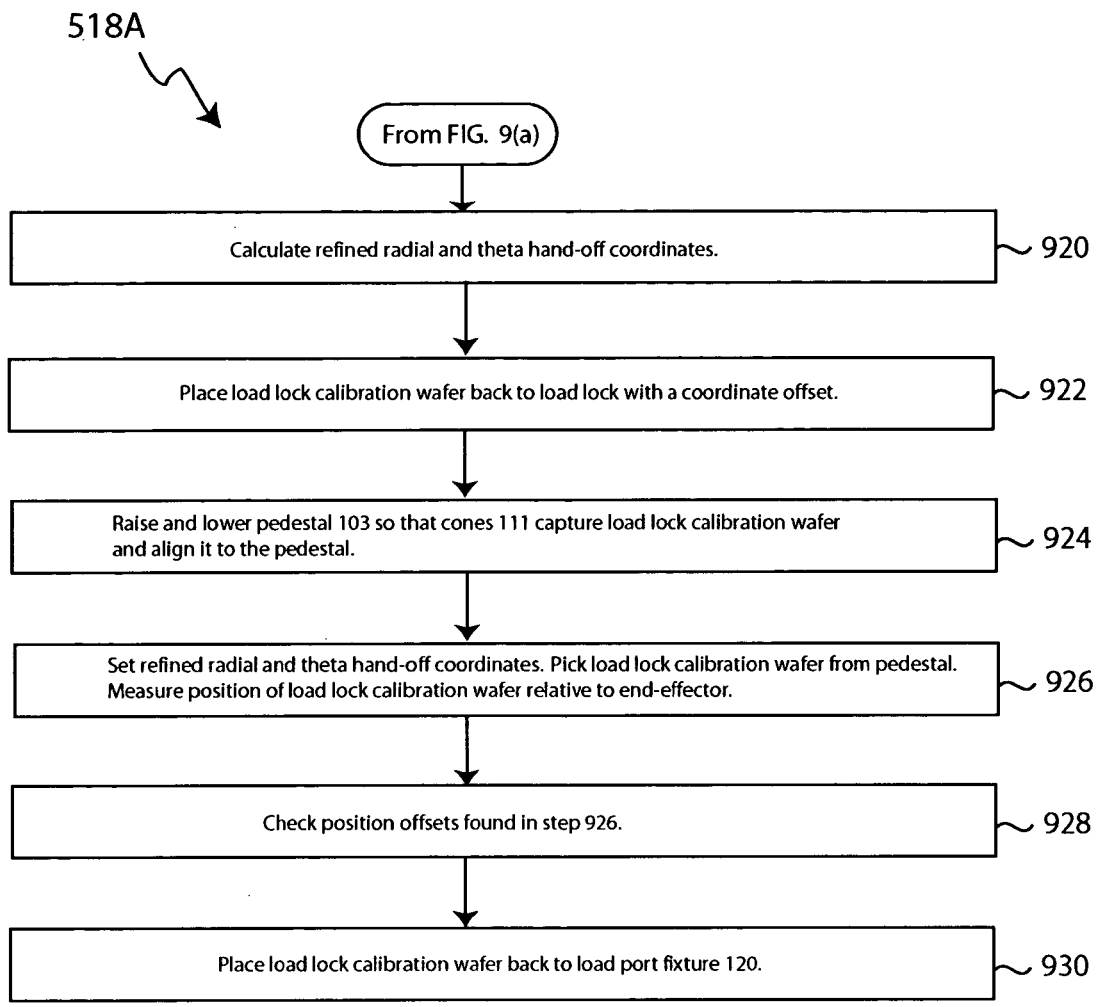

FIG. 9, which consists of FIGS. 9(a) and 9(b), shows a flow diagram of method 518A. Method 518A is a specific embodiment of step 518 shown in FIG. 5. Method 518A will be discussed using load lock 102B as an example. In step 902, a safe height (Z-coordinate) for entering load lock 102B is determined. Step 902 may be performed by scanning for external Z flag 115 using mapping sensor beam 191 of end-effector 160 and a series of Z axis moves and forward (radial) steps. The nominal theta coordinate for the start of this scan sequence may be adjusted using the theta offset found in step 612 (see FIG. 6). The found external Z flag 115 location may be used to calculate a Z coordinate that is safe for end-effector 160 to enter load lock 102B.

In step 904, wafer presence sensor 114 of load lock 102B (see FIG. 1(b)) is found. Step 904 may be performed by moving end-effector 160 into load lock 102B using the safe Z height found in step 902, and using the fingers and alignment holes of end-effector 160 in conjunction with radial and theta sweeps to locate wafer presence sensor 114.

The nominal theta coordinate for the start of this scan sequence may be adjusted using the theta offset found in step 612 (see FIG. 6).

In step 906, the wafer transfer plane is determined. The "wafer transfer plane", which is also known as "base transfer offset" (BTO), defines a Z plane for picking-up or placing a wafer in a load lock (or other locations). Step 906 may be performed by locating internal Z flag 112 in load lock 102B using the theta coordinate of found wafer presence sensor 114. The Z coordinate of the wafer transfer plane may then be calculated using the found internal Z flag 112 coordinates and known geometry of load lock 102B.

In step 908, the initial radial and theta wafer hand-off coordinates are determined. In cases where the wafer support of a load lock is fixed in the horizontal plane, the radial and theta coordinates of wafer presence sensor 114 found in step 904 may be used as initial radial and theta coordinates for wafer hand-off. For more accuracy or in cases where the wafer support is moveable in the horizontal plane to some degree, step 904 may be performed by getting another radial data point. For example, step 904 may be performed by raising pedestal 103, and then detecting the edge of pedestal 103 using sensor beam 191 (see FIG. 3(*b*)). The found radial coordinate of the edge of pedestal 103 may then be used to calculate a more accurate initial radial coordinate for wafer hand-off.

In step 910, the initial radial and theta hand-off coordinates found in step 908 are set. In other words, robot 150 will use the initial radial and theta hand-off coordinates to place or pick wafers in load lock 102B unless the place or pick command includes an offset.

In step 912, robot 150 picks-up a load lock calibration wafer from load port fixture 120. The position of the load lock calibration wafer relative to center 161 of end-effector 160 may then be calculated using the measured location of an AWC sensor 117 from step 606 or 608 (see FIG. 6) and a series of rotation and extension arm moves to pass the wafer through the sensor beam to detect the location of the wafer's edge. Offsets between center 161 and the center of the load lock calibration wafer (e.g., X and Y offsets relative to the end-effector; see FIG. 3(*b*)) are calculated. FIG. 3(*b*) shows the X and Y axes as a reference frame relative to the center of vacuum chuck 163.

In one embodiment, the load lock calibration wafer is similar to a regular wafer except that the load lock calibration wafer is slightly oversized and does not have a notch. For example, the load lock calibration wafer may be about 300.6 mm in diameter for calibrating a load lock configured to accept 300 mm wafers. An oversized calibration wafer mimics the size of a wafer that has just been processed; typically, a newly processed wafer is slightly larger than a pre-processed wafer because of thermal expansion. The load lock calibration wafer does not have a notch to minimize errors during wafer center measurements.

In step 914, offsets found in step 912 and the initial hand-off coordinates found in step 908 are used to calculate a place offset such that the center of the load lock calibration wafer is aligned to the initial hand-off coordinates when the load lock calibration wafer is placed in load lock 102B. Using the place offset, the load lock calibration wafer is then placed inside load lock 102B by resting the load lock calibration wafer on the arm of transfer mechanism 122 while pedestal 103 is in the down position (see FIG. 1(*e*)).

In step 916, pedestal 103 is raised and lowered so that cones 111 capture the load lock calibration wafer and align it to the pedestal. After pedestal 103 is lowered, the load lock calibration wafer will be resting on the arm of transfer mechanism 122.

In step 918, robot 150 picks up the load lock calibration wafer using the initial radial and theta hand-off coordinates. The position of the load lock calibration wafer relative to center 161 of end-effector 160 is then measured. Offsets between center 161 and the center of the load lock calibration wafer are calculated.

In step 920 (FIG. 9(*b*)), refined radial and theta hand-off coordinates are calculated using the offsets found in step 918. In one embodiment, load lock hand-off coordinates are not reset to the refined radial and theta hand-off coordinates at this time. As will be more apparent below, resetting of load lock hand-off coordinates may be performed in step 926. That is, in step 920, the hand-off coordinates in load lock 102B are still based on the initial radial and theta hand-off coordinates found in step 908.

In step 922, the load lock calibration wafer is placed back in load lock 102B with an intentional coordinate offset (e.g., an offset of about −1 mm in R). This will result in cones 111 re-aligning the load lock calibration wafer on pedestal 103 when pedestal 103 lifts the load lock calibration wafer.

In step 924, pedestal 103 is raised and lowered so that cones 111 capture the load lock calibration wafer and align it to the pedestal. After pedestal 103 is lowered, the load lock calibration wafer will be resting on the arm of transfer mechanism 122.

In step 926, the refined radial and theta hand-off coordinates found in step 920 are set as the radial and theta hand-off coordinates in load lock 102B. Robot 150 then picks-up load lock calibration wafer using the refined hand-off coordinates. The position of the load lock calibration wafer relative to center 161 of end-effector 160 is measured. Offsets between the load lock calibration wafer and center 161 are calculated based on the measurement.

In step 928, the offsets found in step 926 are compared to an allowable range. If the offsets are not within the allowable range, an alarm is triggered to alert an operator to diagnose a potential problem. Otherwise, the load lock hand-off coordinates comprising the wafer transfer plane found in step 906 and refined radial and theta hand-off coordinates found in step 920 may be used to pick up and place wafers in load lock 102B.

In step 930, robot 150 places the load lock calibration wafer back to load port fixture 120.

Figure 10:
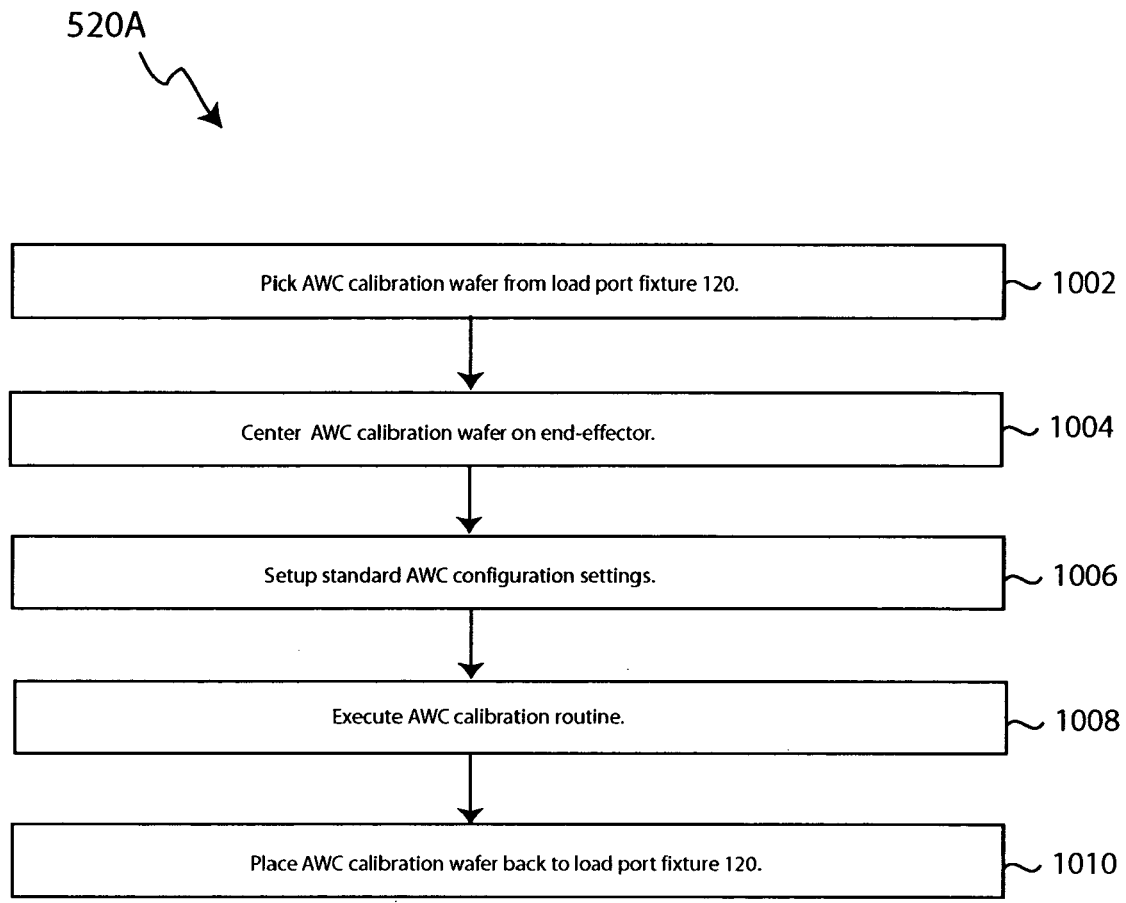

FIG. 10 shows a flow diagram of method 520A, which is a specific embodiment of step 520 shown in FIG. 5. In step 1002, robot 150 picks up an active wafer centering (AWC) calibration wafer from load port fixture 120. In one embodiment, the AWC calibration wafer has the same dimensions as a regular wafer but without a notch. The AWC calibration wafer does not have a notch to minimize errors during active wafer centering measurements.

In step 1004, the AWC calibration wafer is centered on end-effector 160. Step 1004 may be performed by:
 a) measuring the position of the AWC calibration wafer relative to center 161 of end-effector 160;
 b) calculating a place offset to place the AWC calibration wafer centered in load lock 102B;
 c) placing the AWC calibration wafer in load lock 102B using the place offset calculated immediately above; and
 d) picking-up the AWC calibration wafer using the load lock hand-off coordinates established using method 518A (see FIG. 9), thereby centering the AWC calibration wafer on end-effector 160.

In step 1006, the standard configurations settings for the AWC system is setup. Step 1006 will depend on the type and vendor of the AWC system employed. Standard configuration settings may include initialization of variables, resetting of interlocks, and other settings for a particular wafer processing system.

In step 1008, an AWC calibration routine is executed. This step will depend on the type and vendor of the AWC system. In one embodiment where the AWC system is from Brooks-PRI automation, Inc., the AWC calibration routine commands robot 150 to make several extend and retract moves through AWC sensors 116 and 117 to learn wafer edge coordinates associated with a properly centered wafer. The results of the AWC calibration routine are saved. Post AWC calibration standard configuration settings may also be made at this time.

In step 1010, robot 150 places the AWC calibration wafer back to load port fixture 120.

Techniques for automatically calibrating a wafer-handling robot have been disclosed. While specific embodiments have been provided, it is to be understood that these embodiments are for illustration purposes and not limiting. Many additional embodiments will be apparent to persons of ordinary skill in the art reading this disclosure.

What is claimed is:

1. A method of automatically calibrating a wafer-handling robot, the method comprising:
    determining an orientation of a robot relative to a chassis of a wafer processing system;
    determining hand-off coordinates of a load port in the wafer processing system; and
    determining hand-off coordinates of a first load lock in the wafer processing system;
    wherein determining the orientation of the robot relative to the chassis of the wafer processing system comprises:
        using the robot to find a first sensor located on one end of the wafer processing system;
        using the robot to find a second sensor located on another end of the wafer processing system;
        determining a distance between the first sensor and the second sensor; and
        determining an offset between a coordinate frame of the robot and a coordinate frame of the wafer processing system.

2. The method of claim 1 further comprising:
    performing wafer mapping calibration using a load port fixture; and
    performing a wafer centering calibration routine.

3. The method of claim 1 further comprising:
    comparing the distance to an expected value or a range of values.

4. The method of claim 1 wherein determining the hand-off coordinates of the load port comprises:
    adjusting theta coordinates of locations in a load port fixture based on the orientation of the robot relative to the chassis of the wafer processing system;
    moving an end-effector of the robot to a first wafer slot of the load port fixture;
    moving the end-effector to a second wafer slot of the load port fixture; and
    determining a leveling difference between z-axes of the robot and the load port.

5. The method of claim 1 wherein determining the hand-off coordinates of the first load lock in the wafer processing system comprises:
    determining a safe z-coordinate for entering the first load lock;
    determining a wafer transfer plane; and
    determining radial and theta coordinates for wafer hand-off.

6. The method of claim 5 wherein determining the safe z-coordinate for entering the first load lock comprises:
    using the robot to find a feature located outside the first load lock.

7. The method of claim 1 wherein the wafer processing system comprises a chemical vapor deposition system.

8. A calibration fixture for automatically calibrating a load port in a wafer processing system, the calibration fixture comprising:
    a plurality of wafer slots;
    a first sensor having a beam configured along an axis that represents a wafer center; and
    a calibration disk, wherein the calibration disk includes a surface simulating an edge of a wafer.

9. The calibration fixture of claim 8 wherein the calibration disk includes a central hole through which the beam of the first sensor passes through.

10. The calibration fixture of claim 8 further comprising a flag for providing a z-axis reference.

11. The calibration fixture of claim 10 wherein the flag comprises a metallic disk.

12. The calibration fixture of claim 8 wherein the calibration fixture simulates a front-opening unified pod (FOUP).

13. The calibration fixture of claim 8 further comprising an interface port for allowing a sensor signal from the calibration fixture to be coupled to a computer.

14. A method of automatically calibrating a wafer-handling robot to a loading port of a wafer processing system, the method comprising:
    providing a calibration fixture;
    determining radial and theta locations in the calibration fixture;
    determining a z-reference in the calibration fixture;
    moving an end-effector of a robot to a first wafer slot in the calibration fixture;
    moving the end-effector to a second wafer slot in the calibration fixture; and
    determining a leveling difference between z-axes of the robot and the calibration fixture.

15. The method of claim 14 wherein determining the radial and theta locations in the calibration fixture comprises:
    finding a sensor beam passing along an axis that represents a wafer center in the calibration fixture.

16. The method of claim 14 wherein the calibration fixture simulates a front-opening unified pod (FOUP).

17. The method of claim 14 wherein determining the z-reference in the calibration fixture comprises:
    determining an initial z-reference; and
    determining a refined z-reference.

18. The method of claim 17 wherein determining the initial z-reference comprises finding a calibration disk mounted in the calibration fixture, and wherein determining the refined z-reference comprises refining the initial z-reference by finding a flag in the calibration fixture.

19. A method of automatically calibrating a wafer-handling robot, the method comprising:
    determining an orientation of a robot relative to a chassis of a wafer processing system;
    determining hand-off coordinates of a load port in the wafer processing system; and determining hand-off coordinates of a first load lock in the wafer processing system;

wherein determining the hand-off coordinates of the load port comprises:

adjusting theta coordinates of locations in a load port fixture based on the orientation of the robot relative to the chassis of the wafer processing system;

moving an end-effector of the robot to a first wafer slot of the load port fixture;

moving the end-effector to a second wafer slot of the load port fixture; and determining a leveling difference between z-axes of the robot and the load port.

20. The method of claim 19 further comprising:

performing wafer mapping calibration using the load port fixture; and performing a wafer centering calibration routine.

21. The method of claim 19 wherein determining the orientation of the robot relative to the chassis of the wafer processing system comprises:

using the robot to find a first sensor located on one end of the wafer processing system;

using the robot to find a second sensor located on another end of the wafer processing system;

determining a distance between the first sensor and the second sensor; and determining an offset between a coordinate frame of the robot and a coordinate frame of the wafer processing system.

22. The method of claim 21 further comprising:

comparing the distance to an expected value or a range of values.

23. The method of claim 19 wherein determining the hand-off coordinates of the first load lock in the wafer processing system comprises:

determining a safe z-coordinate for entering the first load lock;

determining a wafer transfer plane; and determining radial and theta coordinates for wafer hand-off.

24. The method of claim 23 wherein determining the safe z-coordinate for entering the first load lock comprises:

using the robot to find a feature located outside the first load lock.

25. The method of claim 19 wherein the wafer processing system comprises a chemical vapor deposition system.

* * * * *